(12) United States Patent
Yang et al.

(10) Patent No.: US 11,749,643 B2
(45) Date of Patent: Sep. 5, 2023

(54) SEMICONDUCTOR PACKAGES AND METHODS FOR FORMING THE SAME

(71) Applicant: TAIWAN SEMICONDUCTOR MANUFACTURING COMPANY, LTD., Hsinchu (TW)

(72) Inventors: Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/382,916

(22) Filed: Jul. 22, 2021

(65) Prior Publication Data

US 2022/0285318 A1 Sep. 8, 2022

Related U.S. Application Data

(60) Provisional application No. 63/156,212, filed on Mar. 3, 2021.

(51) Int. Cl.
| | |
|---|---|
| H01L 21/56 | (2006.01) |
| H01L 25/065 | (2023.01) |
| H01L 23/00 | (2006.01) |
| H01L 23/544 | (2006.01) |
| H01L 23/538 | (2006.01) |
| H01L 23/14 | (2006.01) |
| H01L 23/31 | (2006.01) |
| H01L 23/498 | (2006.01) |

(52) U.S. Cl.
CPC .......... *H01L 25/0655* (2013.01); *H01L 21/56* (2013.01); *H01L 23/14* (2013.01); *H01L 23/31* (2013.01); *H01L 23/49811* (2013.01); *H01L 23/5386* (2013.01); *H01L 23/544* (2013.01); *H01L 24/14* (2013.01)

(58) Field of Classification Search
CPC ................................ H01L 21/56; H01L 24/14
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |

(Continued)

*Primary Examiner* — Trang Q Tran
(74) *Attorney, Agent, or Firm* — NZ CARR LAW OFFICE

(57) ABSTRACT

Embodiments of the present disclosure provide an integrated circuit die having edge interconnect features. The edge interconnect features may be conductive lines extending through sealing rings and exposed on edge surfaces of the integrated circuit die. The edge interconnect features are configured to connect with other integrated circuit dies without going through an interposer. The semiconductor device may include two or more integrated circuit dies with edge interconnect features and connected through one or more inter-chip connectors formed between the two or more integrated circuit dies. In some embodiments, the inter-chip connectors may be formed by a selective bumping process during packaging.

20 Claims, 25 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,496,189 B2 | 11/2016 | Yu et al. |
| 2008/0272504 A1* | 11/2008 | Do .......................... H01L 24/97 |
| | | 257/797 |
| 2017/0005035 A1* | 1/2017 | Chen ................... H01L 23/3185 |
| 2022/0199517 A1* | 6/2022 | Dabral .................. H01L 23/528 |

* cited by examiner

SEMICONDUCTOR PACKAGES AND METHODS FOR FORMING THE SAME

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
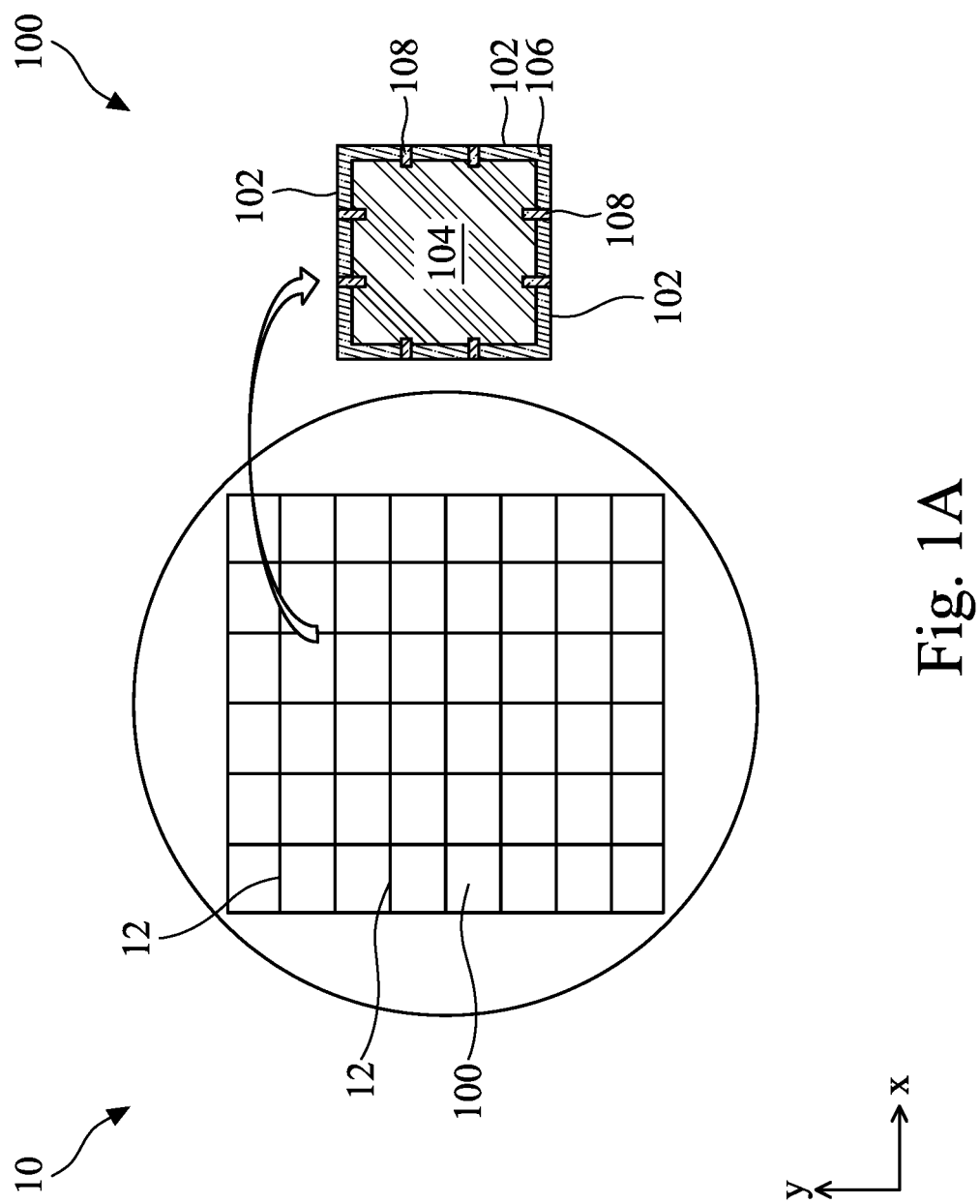
FIGS. 1A-1L schematically demonstrate an integrated circuit die having edge interconnect features according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding. For example, by including a solder bonding (instead of, for example, copper to copper bonding), the bonding temperature of the hybrid bonding can be lowered significantly.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

Embodiments of the present disclosure provide an integrated circuit die having edge interconnect features. The edge interconnect features may be conductive lines extending through sealing rings and exposed on edge surfaces of the integrated circuit die. The edge interconnect features are configured to connect with another integrated circuit die without going through an interposer. The semiconductor device may include two or more integrated circuit dies with edge interconnect features and connected through one or more edge bumping features formed between the two or more integrated circuit dies. In some embodiments, the edge bumping features may be formed by a selective metal bumping process during packaging.

Figure 1B:
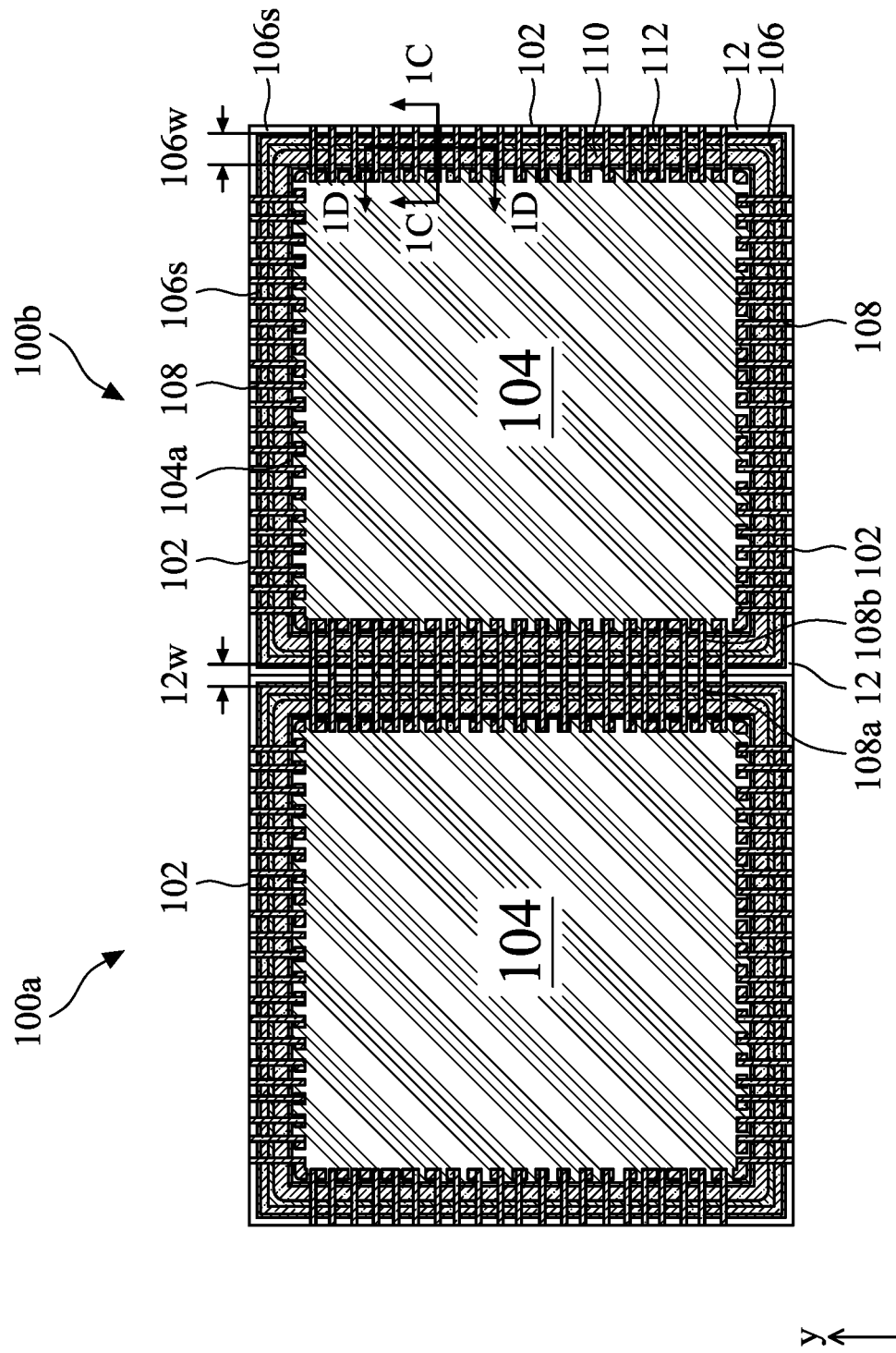
Figure 1C:
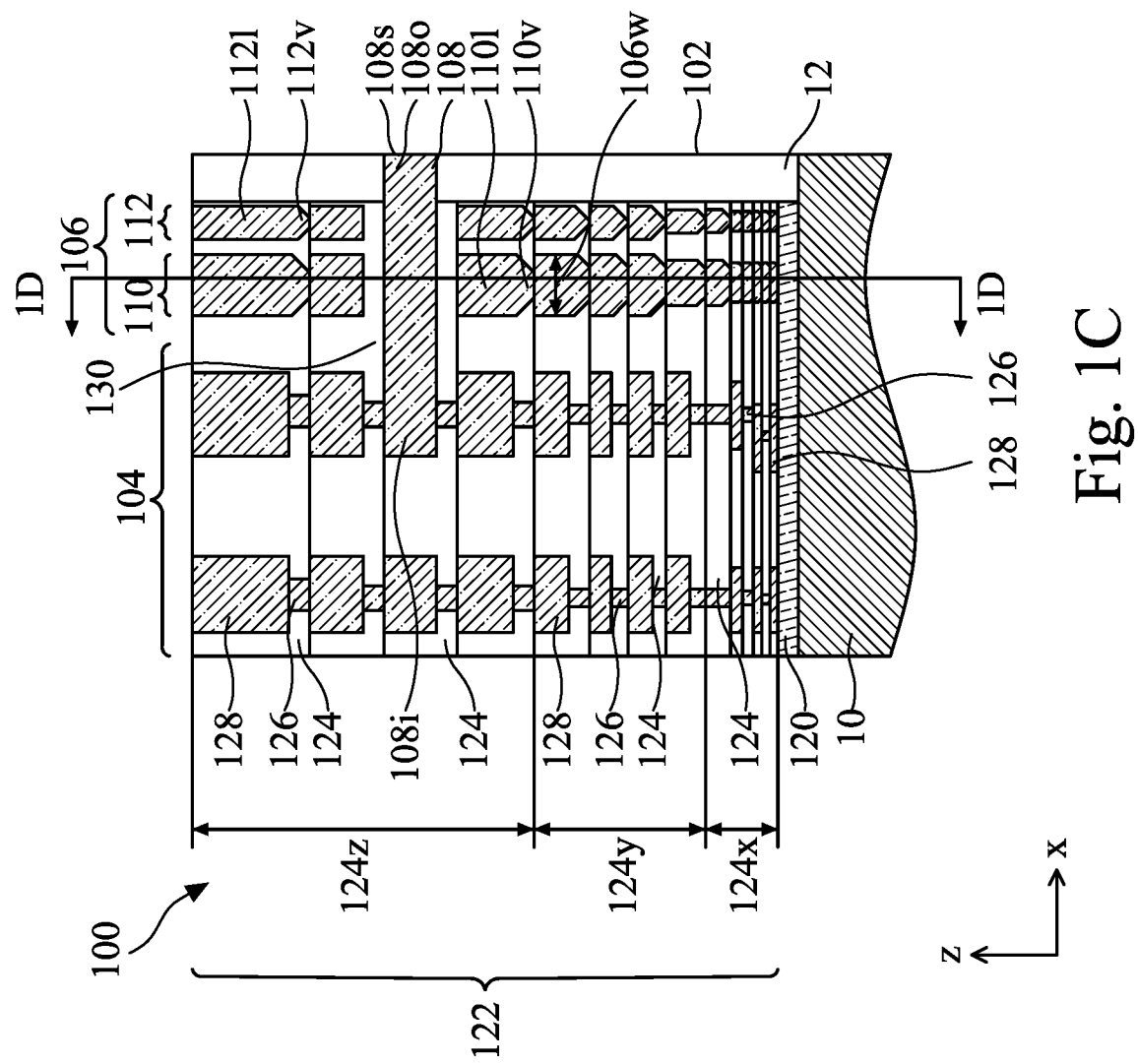
Figure 1D:
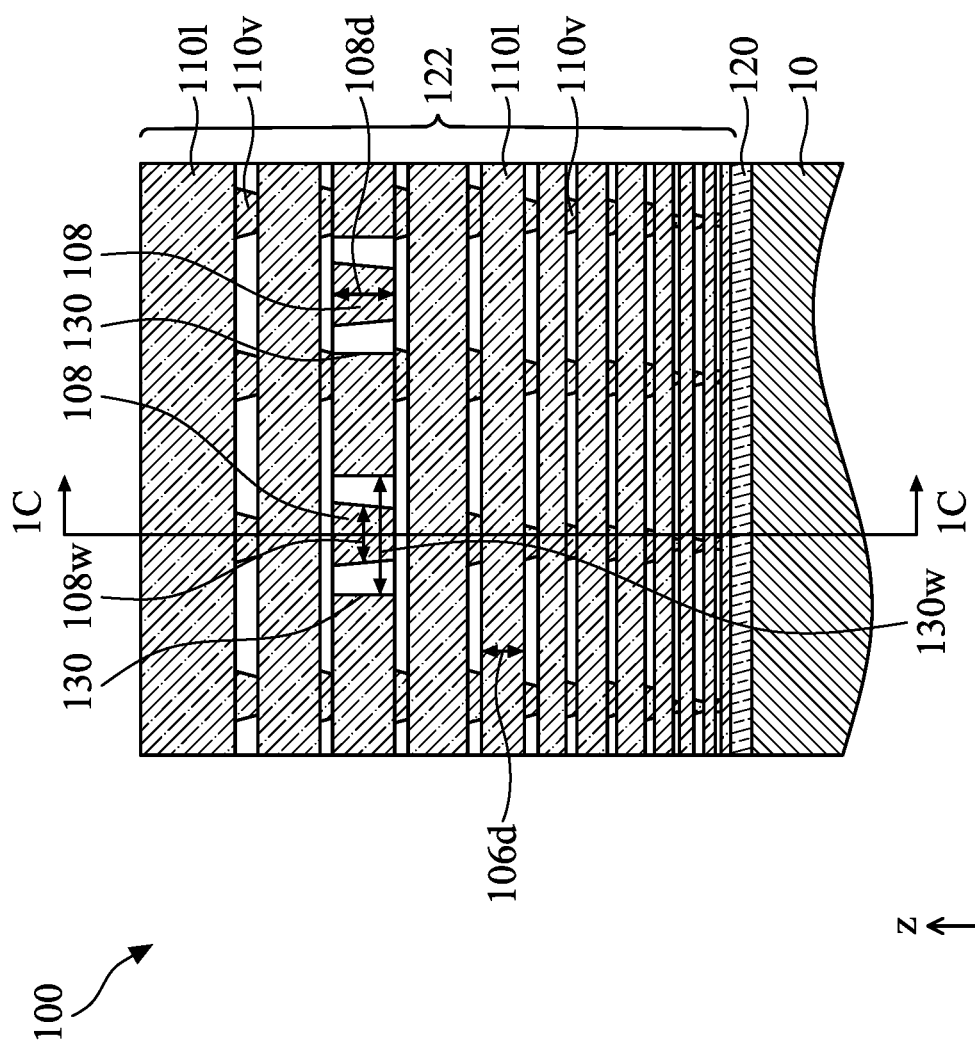
Figure 1E:
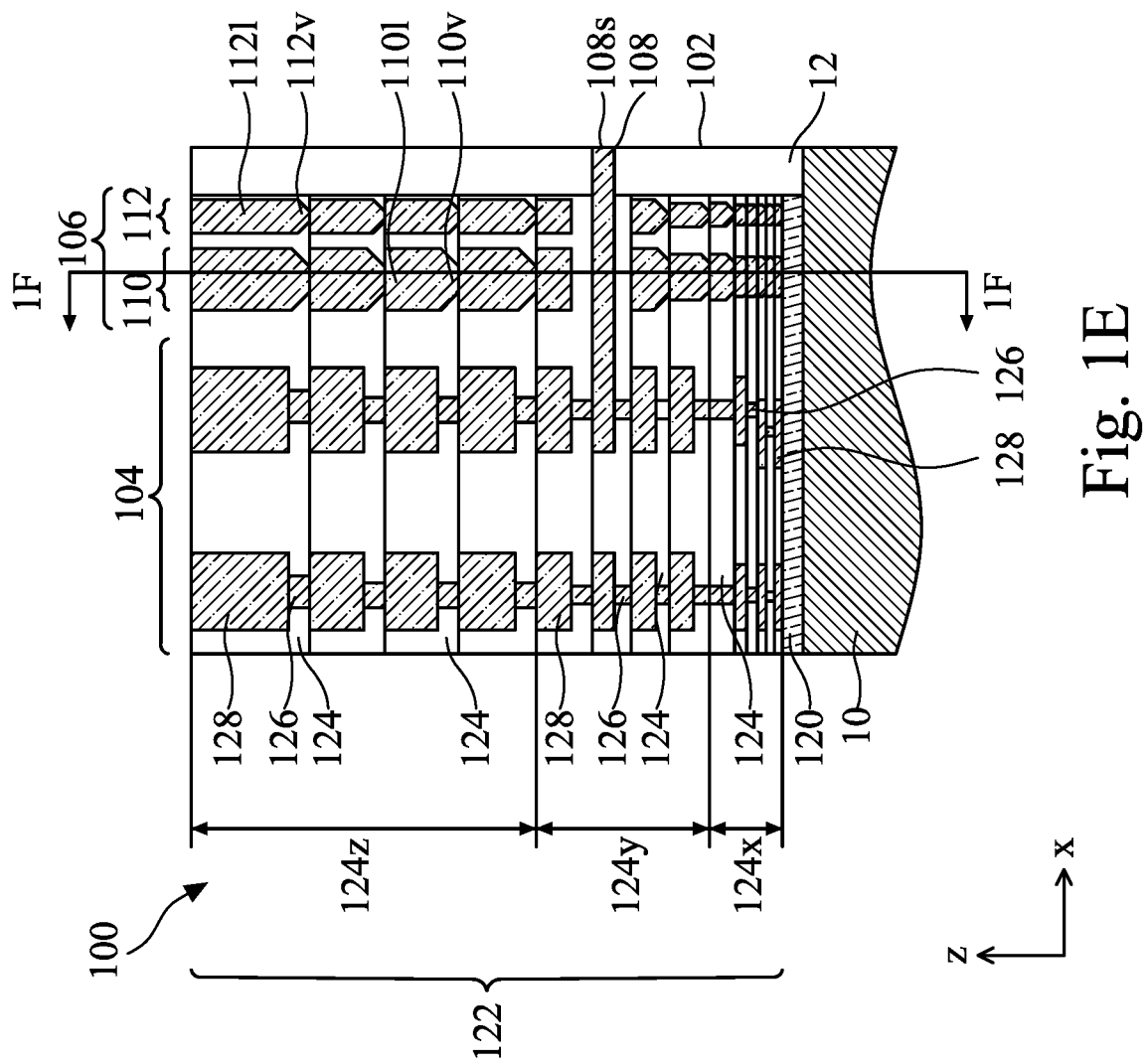
Figure 1F:
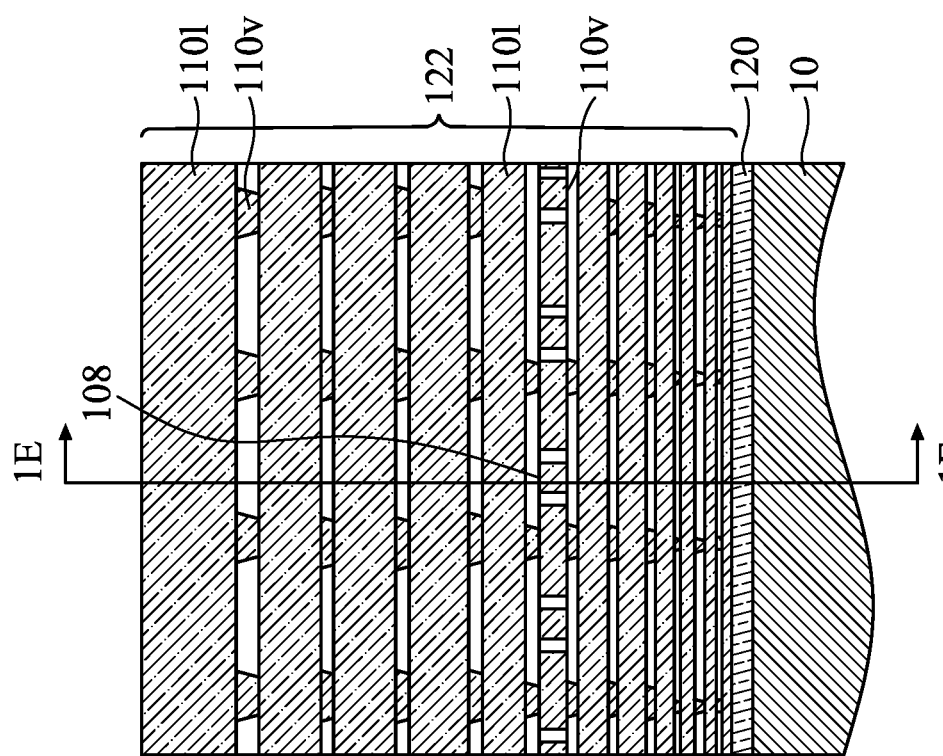
Figure 1G:
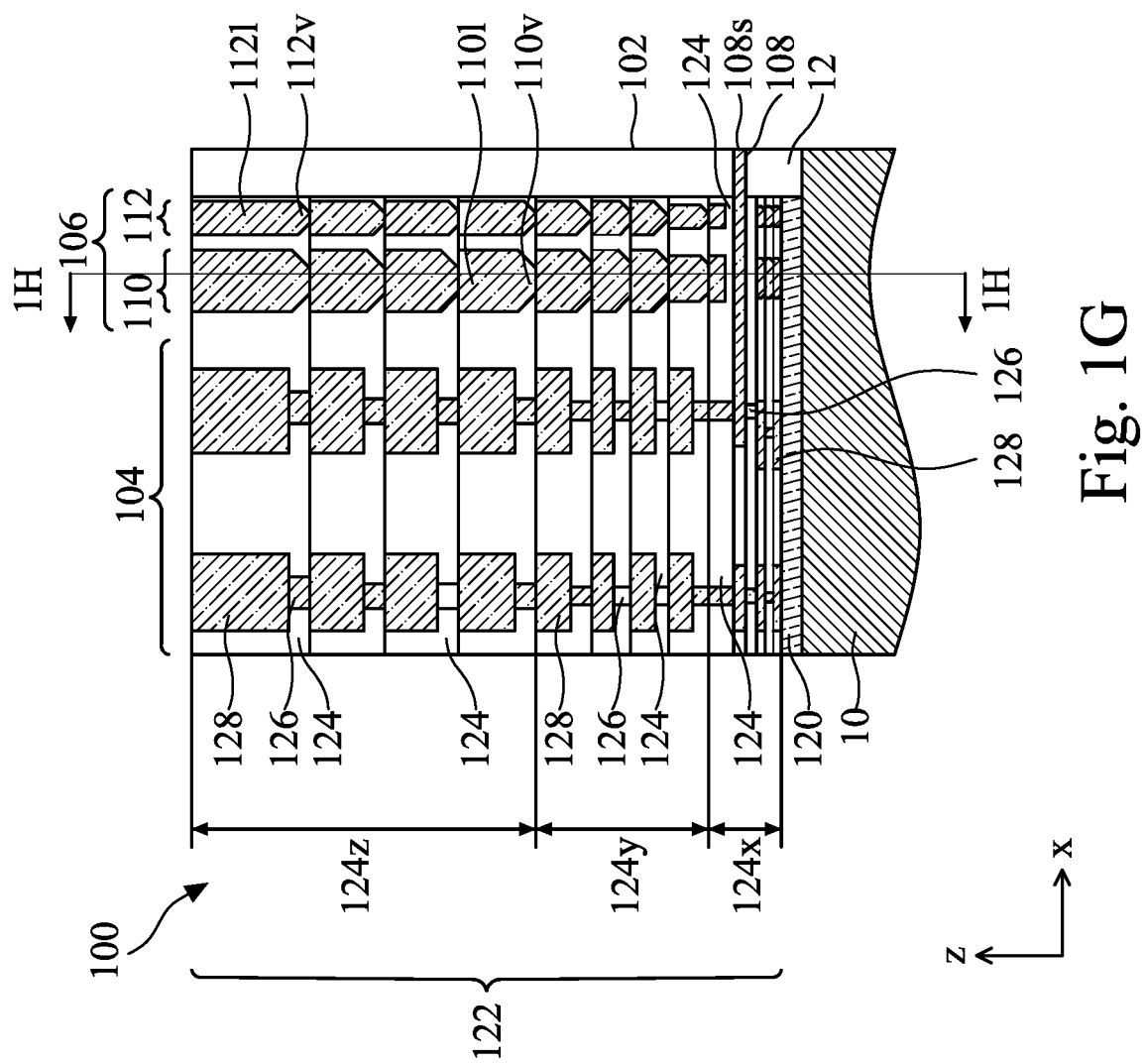
Figure 1H:
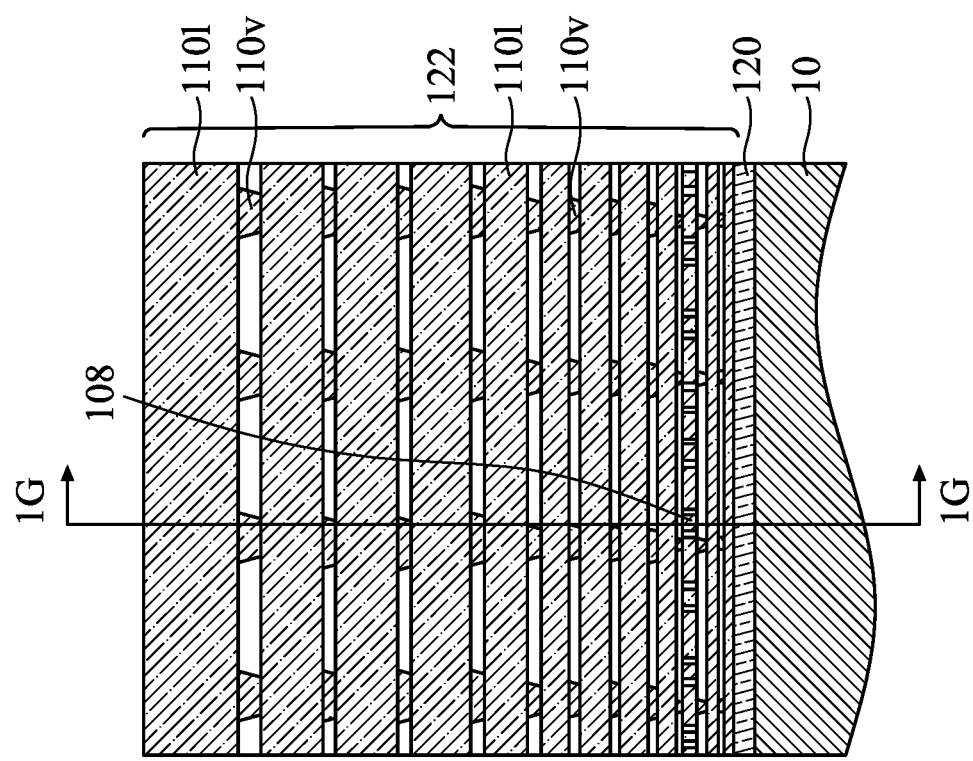

FIGS. 1A-1L schematically demonstrate an integrated circuit die having edge interconnect features according to embodiments of the present disclosure. FIG. 1A is a schematic plan view of a substrate including an array of integrated circuit dies according to the present disclosure. FIG. 1B is a schematic plan view of one integrated circuit die 100 (100a, 100b) according to the present disclosure. FIG. 1C is an enlarged partial sectional view of the integrated circuit die 100 along the line 1C-1C in FIG. 1B. FIG. 1D is an enlarged partial sectional view of the integrated circuit die 100 along the line 1D-1D in FIG. 1C.

As shown in FIG. 1A, an array of integrated circuit dies (or chiplets) 100 are formed on a substrate 10. The array of integrated circuit dies 100 are separated from each other by two sets of intersecting scribe lines 12. One set of scribe lines 12 extend along the x-direction and a second set of scribe lines 12 extend along the y-direction. The array of integrated circuit dies 100 are formed in and/or on the substrate 10 within an array of areas defined by the scribe lines 12. After fabrication, the integrated circuit dies 100, may be tested and cut out along the scribe lines 12 to individual integrated circuit dies 100 for subsequent processing, such as packaging.

As shown in FIG. 1A, each of the integrated circuit die 100 may include a circuit region 104 surrounded by a seal region 106. According to embodiments of the present disclosure, the integrated circuit die 100 includes one or more edge interconnect features 108 extending from the circuit region 104 through the seal region 106 into the scribe line 12. In some embodiments, the edge interconnect features 108 may be conductive lines intersecting with the scribe lines 12 surrounding the integrated circuit die 100. After the integrated circuit die 100 is cut out along the scribe lines 12, the edge interconnect features 108 are exposed on cutting surfaces 102 of the integrated circuit die 100. The edge interconnect features 108 may be conductive lines configured to connect with external contacts formed on the cutting surfaces 102 to provide signal and/or power supplies. In some embodiments, the edge interconnect features 108 may be symmetrically arranged across all scribe lines 12 around the integrated circuit die 100.

The substrate 10 may be a semiconductor substrate, for example, bulk silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as a multi-layered or gradient substrate may also be used.

The array of integrated circuit dies 100 may be formed in and/or on the substrate 10 by performing various semiconductor fabrication processes, including, but not limited to, front-end-of-line (FEOL) processing, and back-end-of-line (BEOL) processing. The various semiconductor fabrication processes are performed to form a device layer 120 (FIGS. 1C and 1D) and an interconnect structure 122 (FIGS. 1C and 1D) in the integrated circuit dies 100.

In some embodiments, the array of integrated circuit dies 100 have substantially identical circuit designs. In other embodiments, the array of integrated circuit dies 100 may include two or more different circuit designs formed on the same substrate 10. The integrated circuit dies 100 may be designed to perform any suitable function. For example, the integrated circuit die 100 may be a logic die (e.g., central processing unit, a SoC, ASIC, FPGA, microcontroller, etc.), a memory die (e.g., a DRAM die, a Wide I/O die, a M-RAM die, a R-RAM die, a NAND die, an SRAM die, etc.), a memory cube (e.g., HBM, HMC, etc.), a high data rate transceiver die, an I/O interface die, an integrated passive device die (e.g., an IPD die), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, the like, or a combination thereof.

FIG. 1B is a schematic plan view of two neighboring integrated circuit dies 100a, 100b according to the present disclosure formed on the substrate 10. In FIG. 1B, components formed in various layers along the z-axis are superimposed on one another to show their relative positions in plan view. Positions of the components along the z-axis are shown corresponding cross-sectional views, such as the views in FIGS. 1C and 1D. FIG. 1B illustrates relative positions of the circuit region 104, the seal region 106, and the edge interconnect features 108 within the integrated circuit dies 100 according to some embodiments. As shown in FIG. 1B, each integrated circuit die 100 is defined in a square area by the scribe lines 12. In some embodiments, the integrated circuit dies 100 may have a plan view area in a range between about 10 mm$^2$ and about 1000 mm$^2$ depending on the circuit design and/or function of the integrated circuit die 100. FIG. 1B illustrates integrated circuit dies with a square shape in the plan view. However, the integrated circuit dies may have other shapes in the plan view. For example, rectangular, hexagonal, octagonal shapes may be used to achieve design purposes. Depending on the design, the scribe lines 12 may have a width 12w in a range between about 1 µm to about 200 µm. A scribe line width 12w lower than 1 µm may not be wide enough to tolerant system errors during separation of the integrated circuit dies 100. A scribe line width 12w greater than 200 µm would increase cost of production without additional benefit.

Within the die area of each integrated circuit die 100, the circuit region 104 is surrounded by the seal region 106 around an outer perimeter of the circuit region 104. One or more sealing rings 110, 112 are concentrically formed in the seal region 106. The seal rings 110, 112 provide protection to circuit structures in the circuit region 104 against undesired elements from the exterior environment, such as water vapor, during and after separation of the integrated circuit dies 100.

Even though two sealing rings 110, 112 are shown in the integrated circuit die 100, less or more sealing rings may be included in the seal region 106. After being cut along the scribe lines 12, the portion of the scribe line 12 may remain on sides of the integrated circuit die 100, and the seal region 106 is surrounded by materials of the scribe lines 12 and not exposed on the cutting surfaces 102.

The edge interconnect features 108 are two or more conductive lines extending from the circuit region 104 through the seal region to intersect with the scribe lines 12. In some embodiments, the edge interconnect features 108 may intersect with the corresponding scribe line 12 at a substantially perpendicular manner. In other embodiments, the edge interconnect features 108 may intersect with the corresponding scribe line 12 at a slanted angle. For example, the edge interconnect features 108 may intersect the y-z plan at a slanted angle, such as an angle in a range between about 45 degree to about 90 degree. In some embodiments, the edge interconnect features 108 may be distributed along one or more of sides 106s of the seal region 106. In some embodiments, the edge interconnect features 108 are a plurality of conductive lines distributed along one or more of the sides 106s. In some embodiments, the plurality of conductive lines may be evenly distributed along one or more sides 106s of the seal region 106.

In some embodiments, as shown in FIG. 1B, the edge interconnect features 108 may be symmetrically arranged along all sides 106s of the seal region 106. For example, an equal number of the edge interconnect features 108 are distributed alone every sides 106s of the seal region 106 at a substantially equal pitch. The symmetrical distribution allow corresponding edge interconnect features 108 in neighboring integrated circuit dies 100 to form continuous conductive lines. As shown in FIG. 1B, edge interconnect features 108a of the integrated circuit die 100a are in contact with corresponding edge interconnect features 108b of the integrated circuit die 100a to form a plurality of continuous conductive lines across the shared scribe line 12. Similarly, the edge interconnect features 108a along other sides 106s of the seal region 106 may form continuous line features with corresponding edge interconnect features 108 in the neighboring integrated circuit die 100 along the other sides 106s.

In some embodiments, the edge interconnect features 108a of the integrated circuit die 100a and the corresponding edge interconnect features 108b of the integrated circuit die 100*b* are fabricated as monolithic conductive lines. The monolithic conductive line arrangement may enable direct communication between devices in the neighboring integrated circuit dies, and thus, allowing the neighboring integrated circuit dies to be packaged together without cutting from the scribe lines. The monolithic conductive line arrangement also provides higher tolerance to the cutting operation and ensures that the edge interconnect features 108 are exposed on the cutting surface 102.

In other embodiments, the edge interconnect features 108*a* of the integrated circuit die 100*a* and the corresponding edge interconnect features 108*b* of the integrated circuit die 100*b* are fabricated as two segments separated by material filled in the scribe line 12 therebetween. The segmented conductive line arrangement provides more design flexibility. For example, neighboring integrated circuit dies may have edge interconnect features at different layers, at different placements, and/or of different densities.

The continuous line features ensure that the edge interconnect features 108 are exposed on the cutting surfaces 102 for subsequent wiring and packaging process after the integrated circuit die 100 is cut free from the substrate 10. The symmetrical arrangement of the edge interconnect features 108 also provide design flexibilities. For example, a common scheme of edge interconnect feature arrangement may be used for different integrated circuit dies, such as for different SoCs, and different memory dies. It should be noted that the edge interconnect features 108 may be arranged in any suitable manner to achieve desired design proposes.

FIGS. 1C and 1D provide additional details of the edge interconnect features 108 within the integrated circuit die 100 according to embodiments of the present disclosure. FIG. 1C is an enlarged partial sectional view of the integrated circuit die 100 across the seal region. FIG. 1D is an enlarged partial sectional view of the integrated circuit die 100 along the sealing ring 110.

As shown in FIGS. 1C and 1D, the device layer 120 is formed in and/or on the substrate 10, and the interconnect structure 122 are formed over the device layer 120. The device layer 120 may include various semiconductor devices, such as transistors, diodes, capacitors, resistors, etc., and may be formed in and/or on the substrate 10. In some embodiments, the device layer 120 includes one or more dielectric layers overlying the semiconductor devices therein.

The interconnection structure 122 includes various conductive features, such as a first plurality of conductive features 126 and second plurality of conductive features 128, and one or more intermetal dielectric (IMD) layers 124 to separate and isolate various neighboring conductive features 126, 128. In some embodiments, the first plurality of conductive features 126 are conductive vias and the second plurality of conductive features 128 are conductive lines. The interconnection structure 122 includes multiple levels of the conductive features 128, and the conductive features 128 are arranged in each level to provide electrical paths to the devices in the device layer 120. The conductive features 126 provide vertical electrical routing from the device layer 120 to the conductive features 128, and between the conductive features 128 in different layers.

The conductive features 126 and conductive features 128 may be made from one or more electrically conductive materials, such as one or more layers of graphene, metal, metal alloy, metal nitride, or silicide. For example, the conductive features 126 and the conductive features 128 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layers 124 may be formed, for example, of a low dielectric constant (low-K) dielectric material, such as SiOx, SiOxCyHz, $SiO_xC_y$, SiCx, SiNx, or related low-k dielectric material, compounds thereof, composites thereof, combinations thereof, or the like. The IMD layers 124 may be formed by any suitable method, such as spinning, chemical vapor deposition (CVD), and/or plasma-enhanced CVD (PECVD). In some embodiments, the interconnect structure 122 may be formed sequentially layer-by-layer from the device layer 120 during BOEL processing. In some embodiments, the interconnect structure 122, the conductive features 126 and conductive features 128 may be fabricated using damascene and/or dual-damascene process.

As shown in FIG. 1C, a plurality of IMD layers 124 are sequentially formed over the device layer 120 with the conductive features 126, 128 having increased dimension. The number of IMD layers 124 may be any number suitable for the circuit design. For example, the number of IMD layers 124 may be between 1 and 30. In FIG. 1C, the IMD layers 124 are divided into three groups: bottom IMD layers 124*x*, middle IMD layers 124*y*, top IMD layers 124*z* based on relative position to the device layer 120. The bottom IMD layers 124*x*, formed immediately on the device layer 120 are thinner and with the conductive features 126, 128 of a higher density. The middle IMD layers 124*y* formed over the bottom IMD layers 124*x* are thicker and with the conductive features 126, 128 of a lower density. The top IMD layers 124*z* formed over the middle IMD layers 124*y* are thickest and with the conductive features 126, 128 of a lowest density.

The sealing rings 110, 112 are formed in the seal region 106 between the circuit region 104 and the scribe line 12. Each of the sealing rings 110, 112 includes physically connected components to function as a barrier between the conductive features 126, 128 in the interconnect structure 122 and exterior environment, such as moisture. The sealing rings 110, 112 may be formed by any suitable designs and with any suitable materials, such as materials suitable as moisture barrier. In some embodiments, the sealing rings 110, 112 are formed with electrically conductive materials. In some embodiments, the sealing rings 110, 112 may be electrically grounded. In some embodiments, the sealing rings 110, 112 may be formed from the same material as the conductive features 126, 128. For example, the sealing rings 110, 112 may be formed from Cu, Al, Co, Ru, Mo, W, and related alloys.

FIGS. 1C and 1D schematically demonstrate one example of the sealing rings 110, 112. Other sealing ring structures may be used by persons skilled in the art with the integrated circuit die 100 according to present disclosure. As shown in FIGS. 1C and 1D, each of the sealing rings 110, 112 includes layers of substantially continuous sealing lines 110*l*, 112*l* connected by a plurality of sealing vias 110*v*, 112*v* formed in the IMD layers 124. The continuous sealing lines 110*l*, 112*l* in neighboring IMD layers 124 are connected by the plurality of sealing vias 110*v*, 112*v* respectively. The sealing lines 110*l*, 112*l* and sealing vias 110*v*, 112*v* may be fabricated layer-by-layer in the same process with the conductive features 126, 128 in the corresponding IMD layers 124. Dimension of the sealing lines 110*l*, 112*l* may vary in different IMD layers 124. In some embodiments, the sealing lines 110*l*, 112*l* may have a line width 106*w* in a range between about 0.01 μm and about 6 μm, and a line depth 106$d$ in a range between about 0.01 μm and about 6 μm.

The edge interconnect features 108 may be formed in one or more IMD layers 124. Each of the edge interconnect features 108 may be conductive line having an inner end 108$i$ and an outer end 108$o$. The inner end 108$i$ may be electrically connected to one or more conductive features 128, 126 in the circuit region 104. The outer end 108$o$ is embedded in the scribe line 12 outside the seal region 106. In some embodiments, a portion of the edge interconnect features 108 may be dummy connectors to achieve structural uniformity in the integrated circuit die 100. For example, the inner end 108$i$ of a portion of the edge interconnect features 108 may be "floating" in the IMD layer 124 without connecting to any other conductive features, such as conductive features 126, 128. After the integrated circuit die 100 is cut out, the outer ends 108$o$ of the edge interconnect features 108 is exposed on the cutting surface 102.

The edge interconnect features 108 extend through the sealing rings 110, 112 through openings 130 which are formed in the sealing ring 110, 112 and the corresponding IMD layer 124. Dielectric material of the IMD layer 124 is disposed between the edge interconnect features 108 and the sealing rings 110, 112 to electrically isolate the edge interconnect features 108 from the sealing rings 110, 112.

The edge interconnect features 108 may be formed in the same process with the conductive features 126, 128 in the corresponding IMD layers 124. In some embodiments, the sealing rings 110, 112 may be formed from the same material as the conductive features 126, 128. For example, the edge interconnect features 108 may be formed from Cu, Al, Co, Ru, Mo, W, and related alloys.

In some embodiments, dimensions of the edge interconnect features 108 may be similar to the conductive features 128 in the same IMD layer 124. In some embodiments, the edge interconnect features 108 may have a line width 108$w$ in a range between about 0.01 μm and about 6 μm, and a line depth 108$d$ in a range between about 0.01 μm and about 6 μm. A width 130$w$ of the openings 130 may be in a range between about 0.03 μm and about 18 μm.

Dimension of the edge interconnect features 108 may vary in different IMD layers 124. Depending on the function and density of the edge interconnect features 108, the edge interconnect features 108 may be formed in the bottom IMD layers 124$x$, the middle IMD layers 124$y$, the top IMD layers 124$z$, and a top metal layer (not shown) above the top IMD layer 124$z$. For example, if the edge interconnect features 108 are used to transfer signals to individual devices in the device layer 120, the density of the edge interconnect features 108 is likely to be relatively high and the width of the edge interconnect features 108 may be relatively small, and the edge interconnect features 108 may be formed in one or more bottom IMD layers 124$x$. If the edge interconnect features 108 are used to provide power supply to the device layer 120, the density of the edge interconnect features 108 is likely to be relatively low and the width of the edge interconnect features 108 may be relatively large, and the edge interconnect features 108 may be formed in one or more top IMD layers 124$z$.

In some embodiments, the scribe lines 12 between the integrated circuit dies 100 may also be filled with suitable materials. A dielectric material may be filled in the scribe lines 12 between the integrated circuit dies 100. The outer end 108$o$ of the edge interconnect features 108 are surrounded by the dielectric material in the scribe lines 12, thus, are electrically isolated from one another. In some embodiments, the scribe lines 12 may be filled with the same material as in the IMD layers 124. The scribe lines 12 may be filled and then patterned layer-by-layer in the same process with the conductive features 126, 128 in the corresponding IMD layers 124. In some embodiments, the scribe lines 12 or the dielectric material filled in the scribe lines 12 may include one or more layers of a low dielectric constant (low-K) dielectric material, such as SiOx, SiOxCyHz, SiO$_x$C$_y$, SiCx, SiNx, or related low-k dielectric material, compounds thereof, composites thereof, combinations thereof, or the like.

In the embodiment shown in FIGS. 1C and 1D, the edge interconnect features 108 are formed in the top IMD layer 124$z$. As discussed above, the edge interconnect features 108 according to the present disclosure may be formed in any suitable IMD layers. In the embodiment shown in FIGS. 1E and 1F, the edge interconnect features 108 are formed in the middle IMD layer 124$y$. In the embodiment shown in FIGS. 1G and 1H, the edge interconnect features 108 are formed in the bottom IMD layer 124$x$.

Figure 1I:
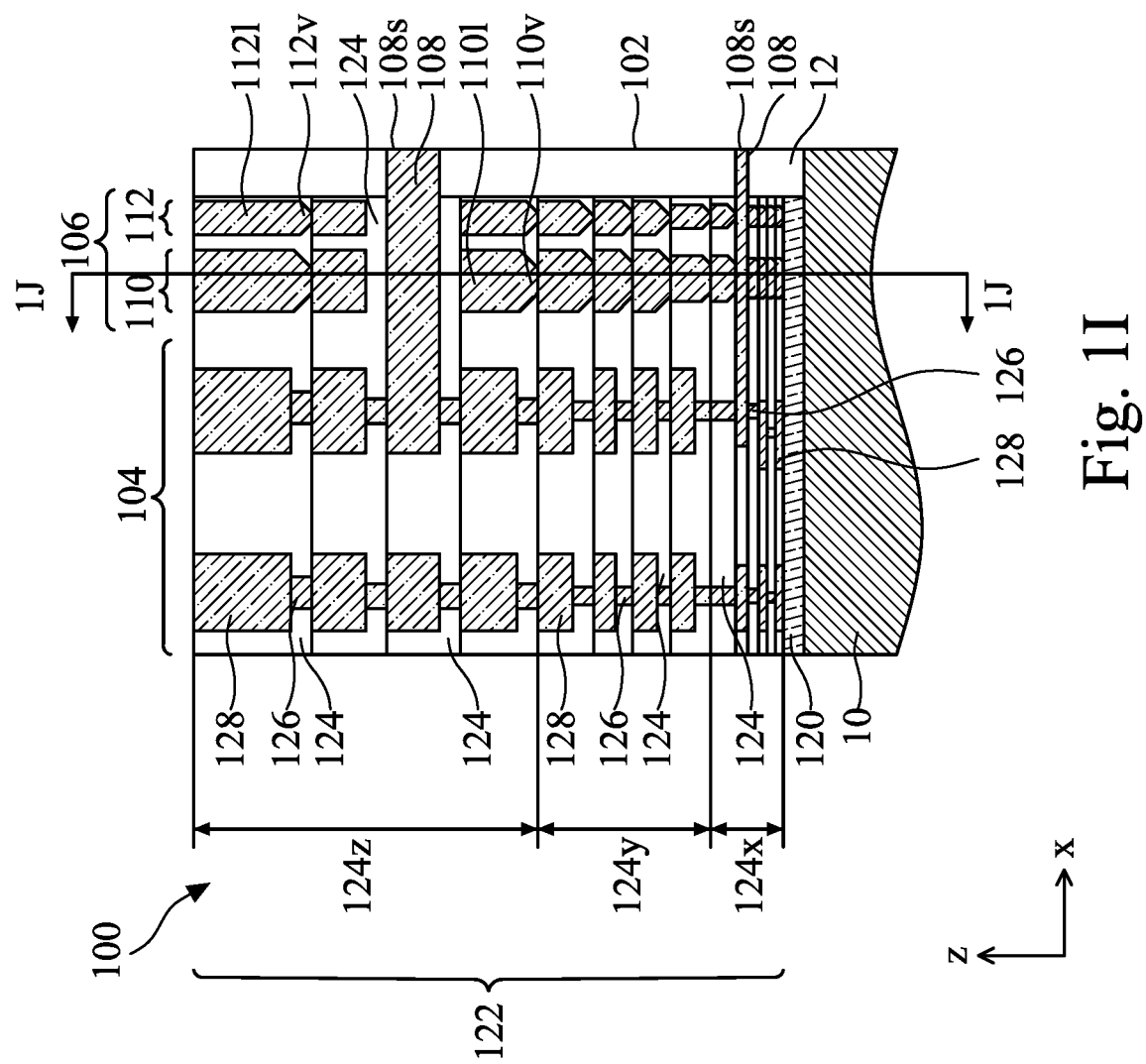
Figure 1J:
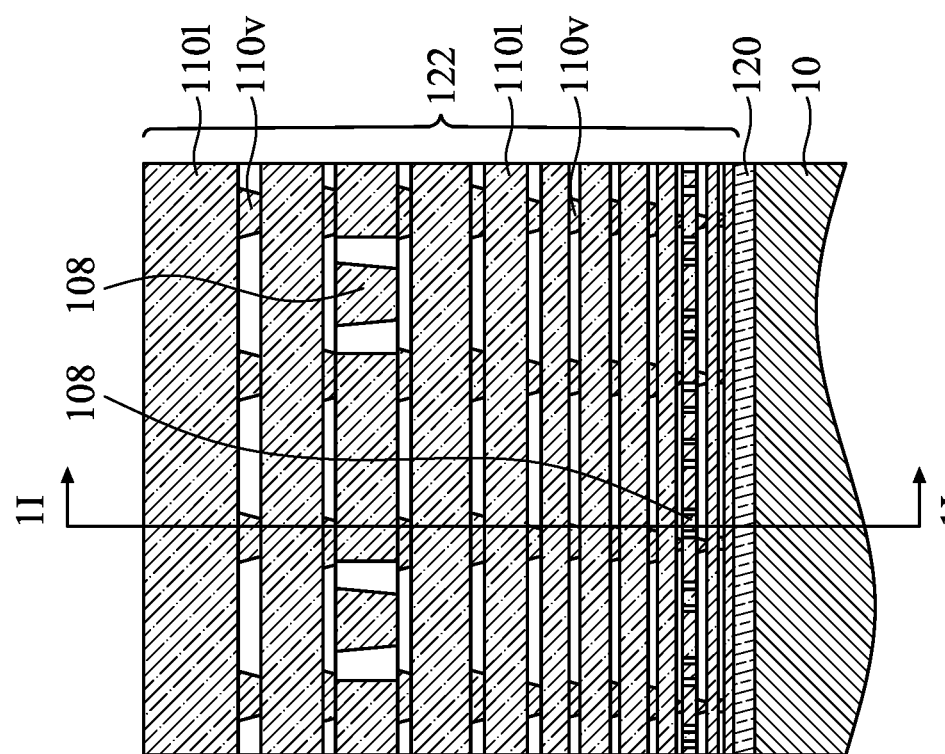

In the embodiment shown in FIGS. 1I and 1J, the edge interconnect features 108 are formed in two or more IMD layers 124. Particularly, in FIGS. 1I and 1J, the edge interconnect features 108 are formed in one of the bottom IMD layer 124$x$ and in one of the top IMD layer 124$z$. It should be noted that the edge interconnect features 108 may be formed in any combination of IMD layers 124.

In some embodiments, the edge interconnect features 108 may be formed in a top metal layer, which may be the topmost layer of the IMD layer 124 or a metal layer immediately under an under-bump metallization (UBM) structure. In the embodiment shown in FIGS. 1L and 1K, the edge interconnect features 108 are formed in the top metal layer.

Figure 1K:
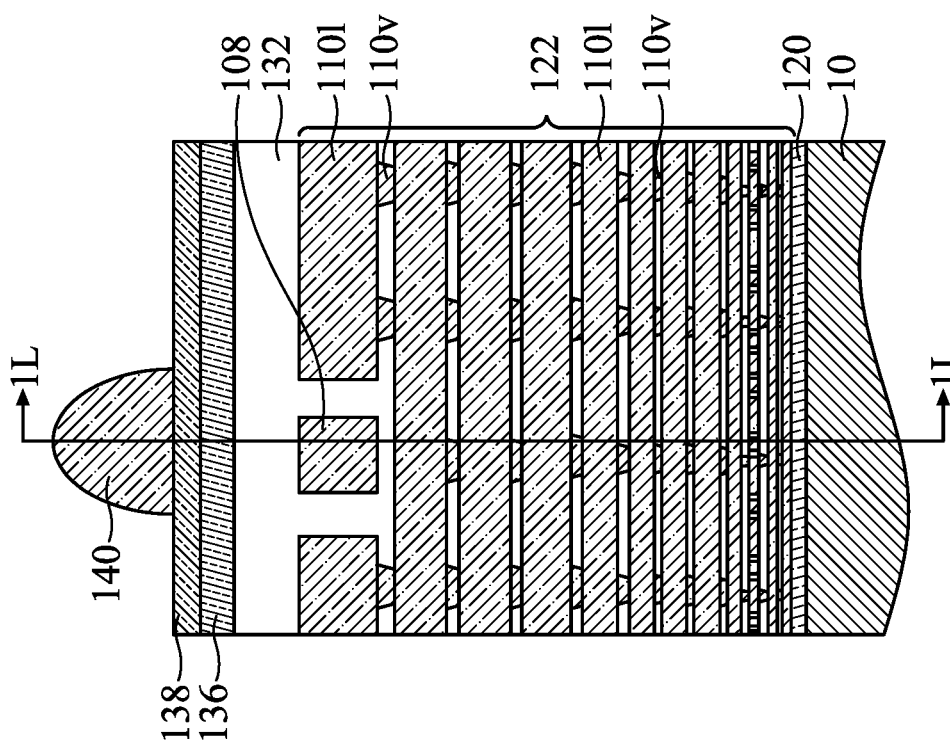
Figure 1L:
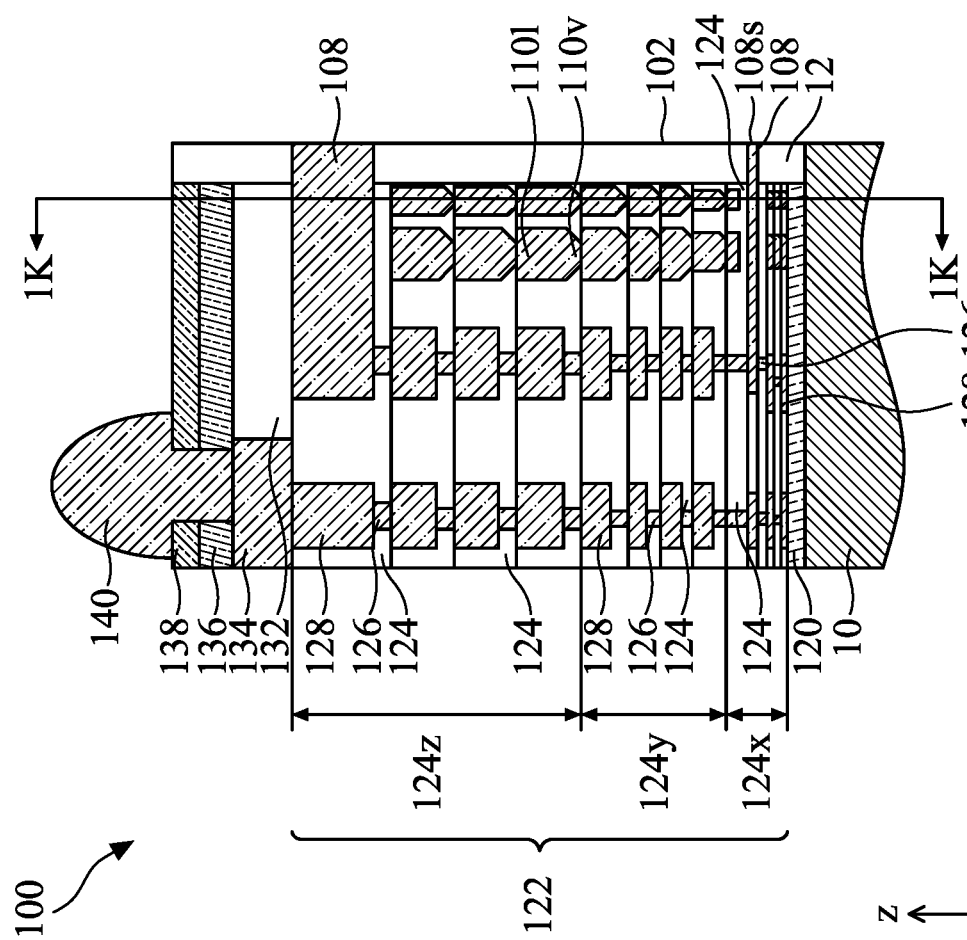

As shown in FIG. 1L, a dielectric layer 132 is formed over the topmost IMD layer 124. One or more contact pads 134 are formed on the interconnect structure 122 to electrically connect the metal lines or vias inside the IMD layers 124. In some embodiments, the contact pads 134 may be formed of aluminum, aluminum copper, aluminum alloys, copper, copper alloys, or the like. A passivation layers, such as a first passivation layer 136 and a second passivation layer 138 are formed over the dielectric layer 132 and patterned to expose portions of the contact pads 134 respectively. In some embodiments, the first passivation layer 136 is formed of a dielectric material, such as undoped silicate glass (USG), silicon nitride, silicon oxide, silicon oxynitride or a non-porous material by any suitable method, such as CVD, PVD, or the like. The second passivation layer 138 may be a polymer layer, such as an epoxy, polyimide, benzocyclobutene (BCB), polybenzoxazole (PBO), or the like, although other relatively soft, often organic, dielectric materials can also be used. Bumps 140 are formed on the corresponding contact pads 134. The bump 140 can be a spherical bump or a pillar bump formed of a conductive material including at least one of solder, Cu, Ni or Au.

As shown in FIGS. 1L and 1K, the edge interconnect features 108 may be formed in the top metal layer and to provide connection to the devices in the device layer 120 in electrical communication with the bumps 140.

FIGS. 2, 3A-3D, 4A-4D, 5A-5B, 6, and 7 schematically demonstrate various stages of forming a semiconductor package 300 according to embodiments of the present disclosure. The semiconductor package 300 includes two or more integrated circuit dies having edge interconnect features according to the present disclosure.

Figure 2:
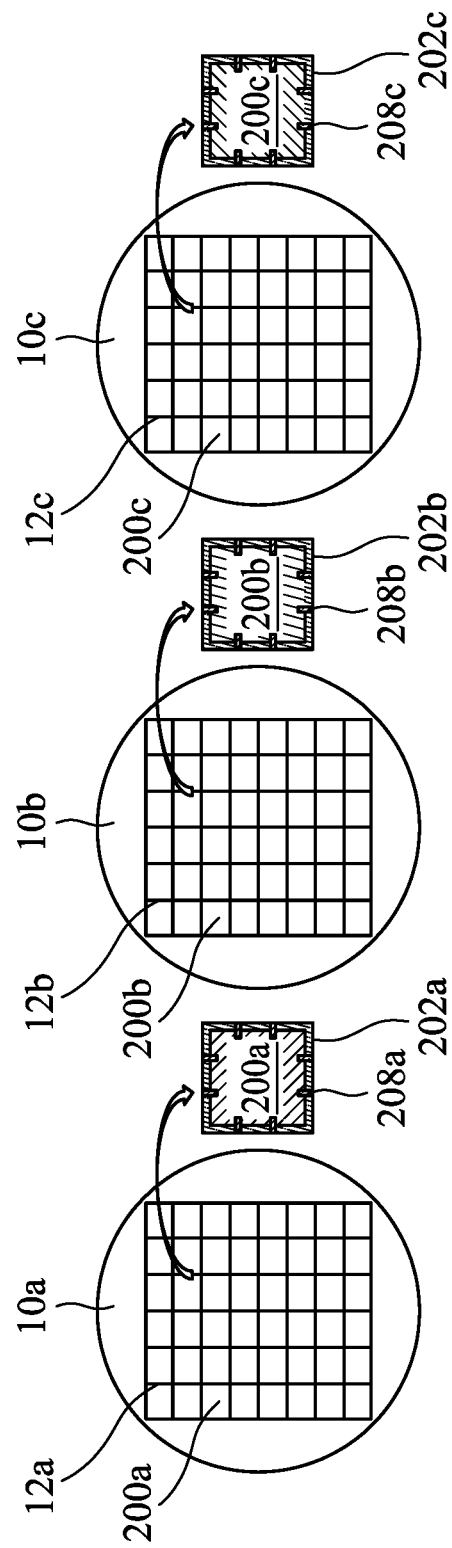
FIGS. 2, 3A-3D, 4A-4D, 5A-5B, 6, and 7 schematically demonstrate various stages of forming a semiconductor package according to embodiments of the present disclosure.
Figure 3A:
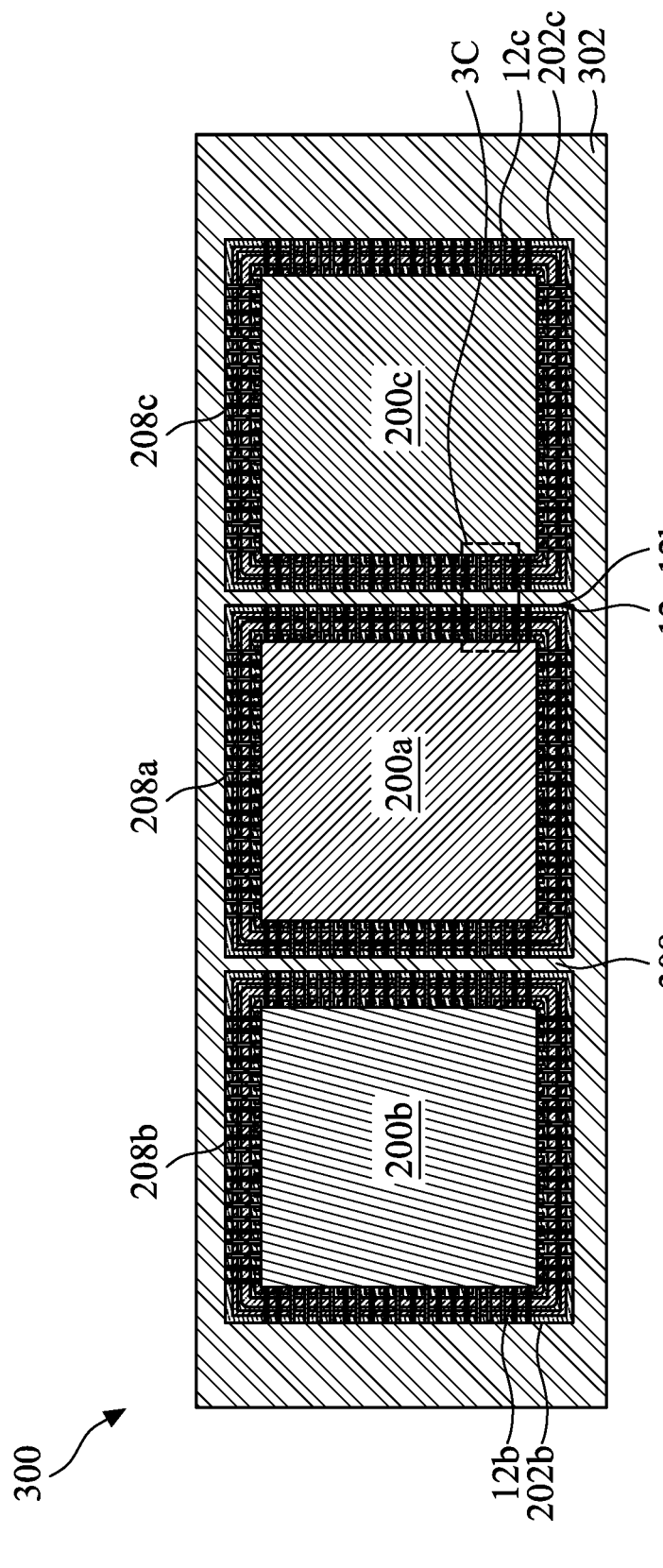
Figure 3B:
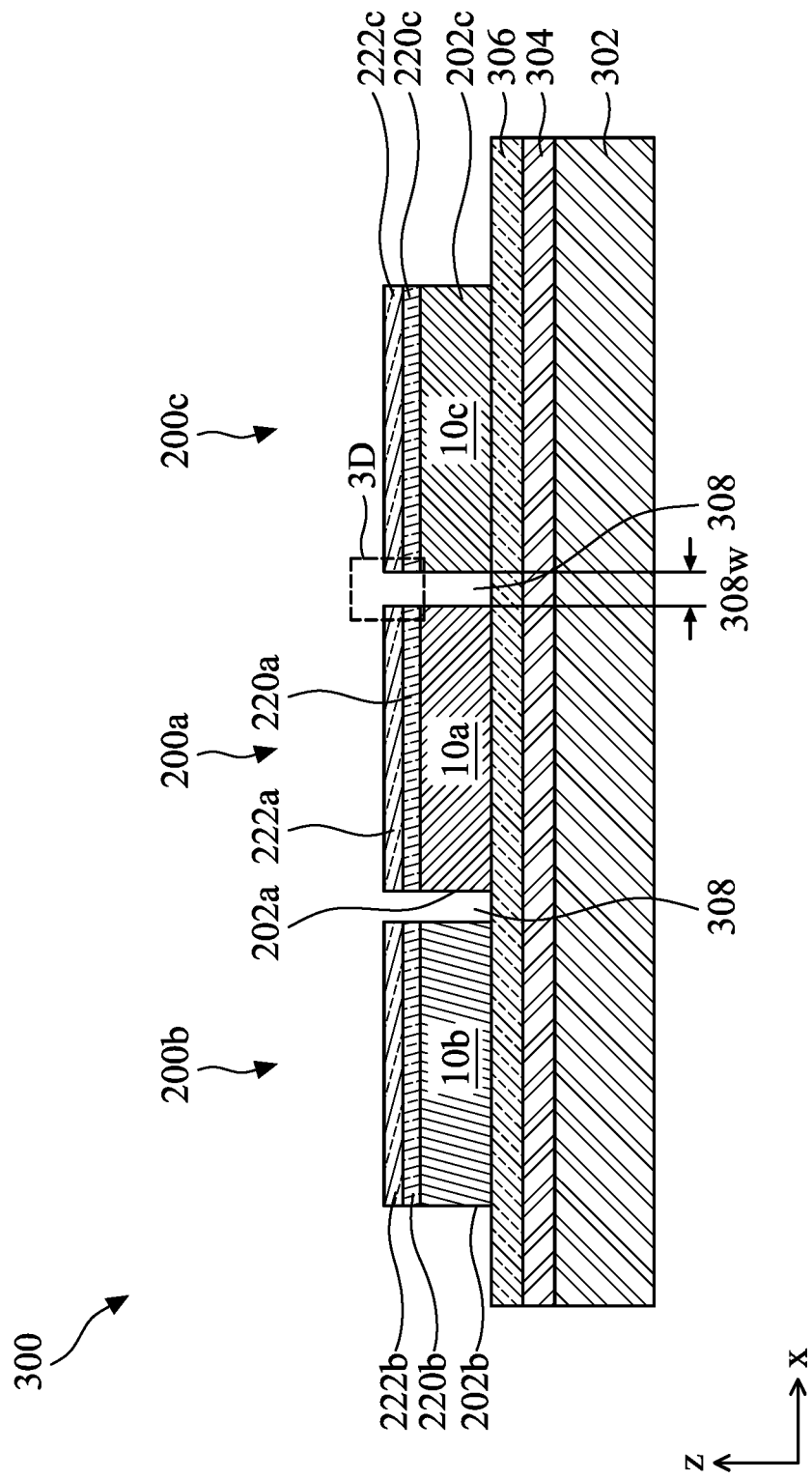
Figure 3C:
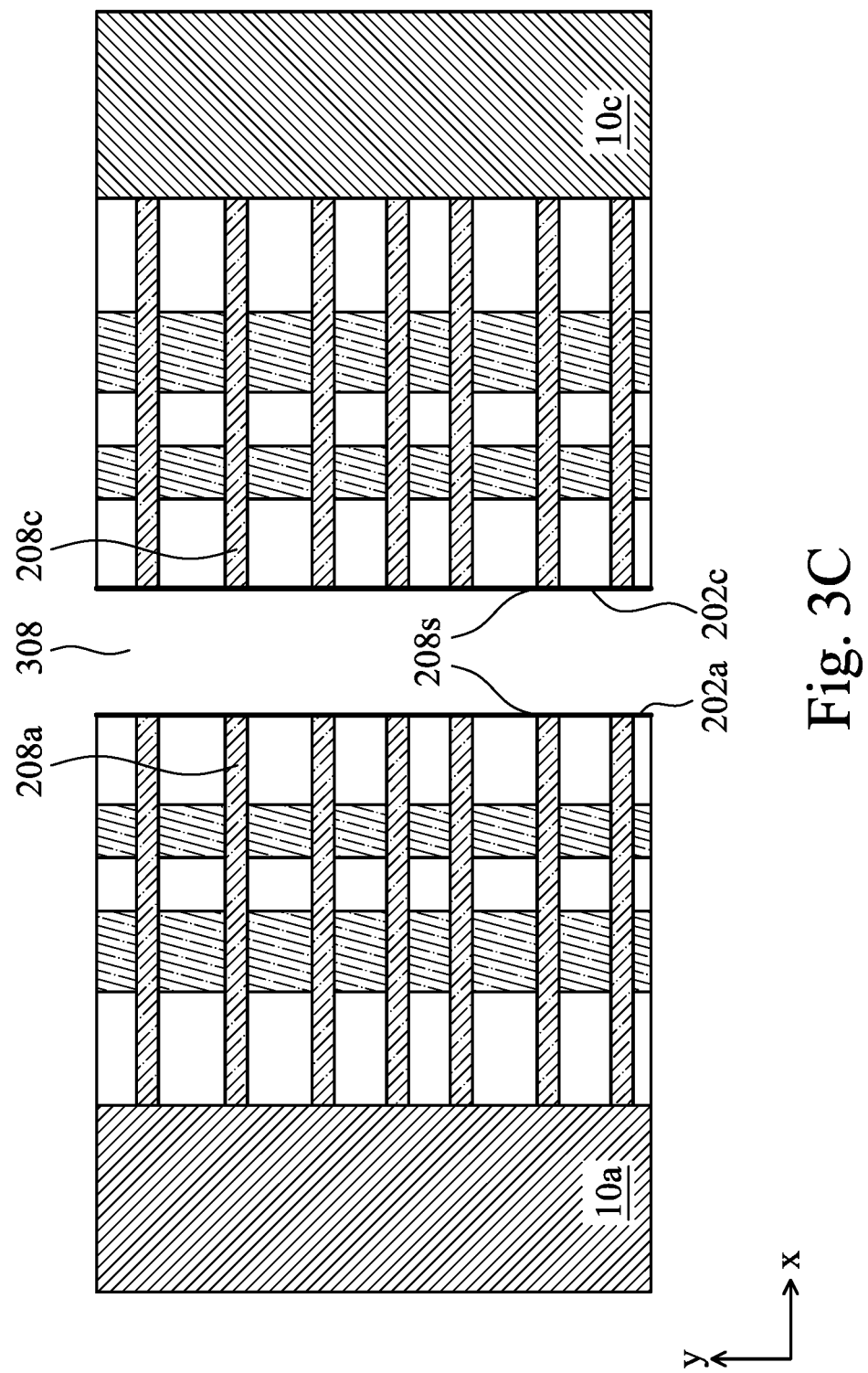
Figure 3D:
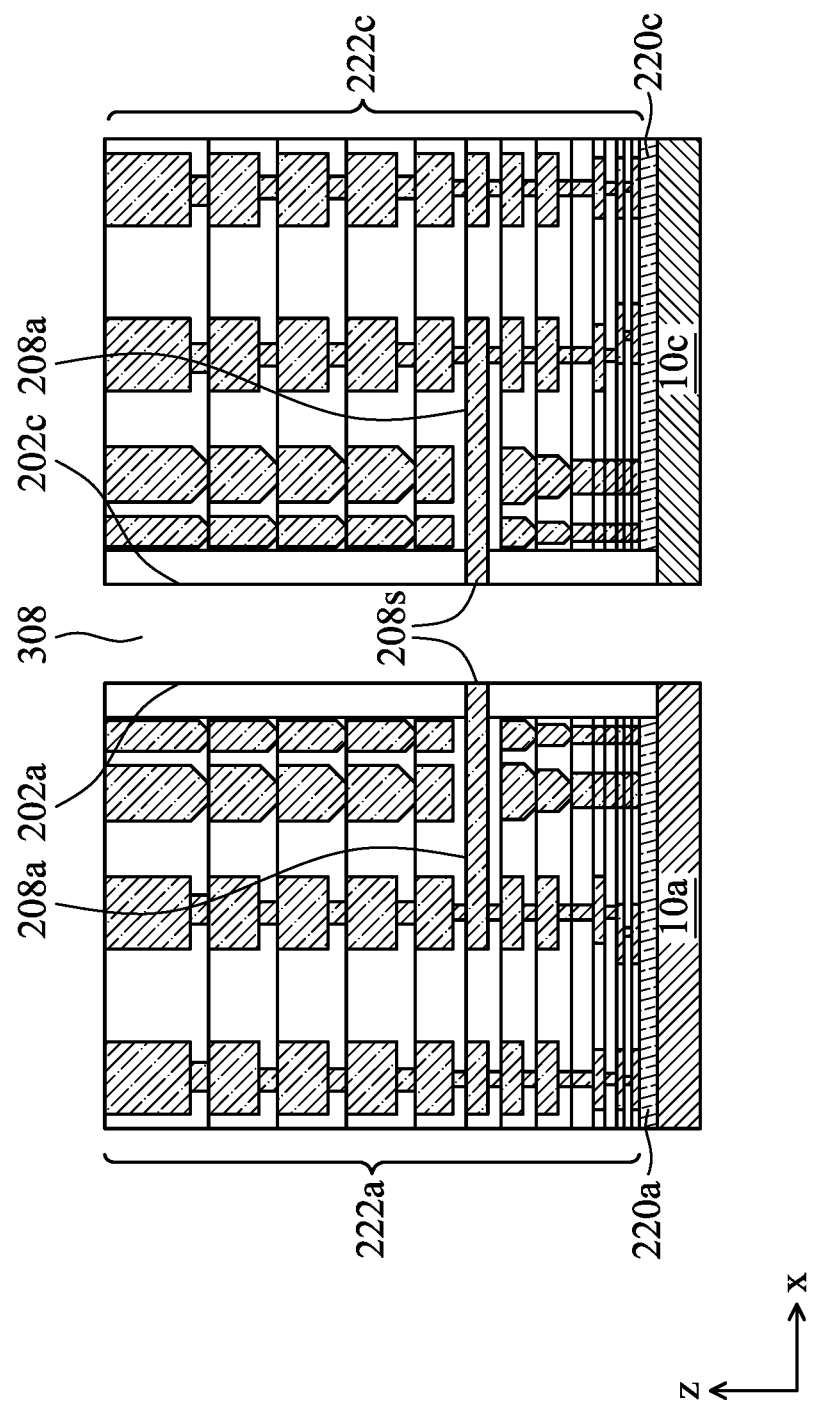

FIG. 2 is schematic plan views of substrates 10$a$, 10$b$, 10$c$ having integrated circuit dies 200$a$, 200$b$, 200$c$ formed thereon. FIG. 3A is a schematic plan view of the semiconductor package 300. FIG. 3B is a schematic cross-sectional view of the semiconductor package 300. FIG. 3C is a partial enlarged view of the area 3C in FIG. 3A. FIG. 3D is a partial enlarged view of the area 3D in FIG. 3B.

As shown in FIG. 2, the integrated circuit dies 200a, 200b, 200c may be fabricated separately on different substrates 10a, 10b, 10c. Alternatively, some or all of the integrated circuit dies 200a, 200b, 200c may be fabricated on the same substrate.

In some embodiments, the integrated circuit dies 200a, 200b, 200c may include any suitable circuit designs to achieve different functions. For example, each of the integrated circuit dies 200a, 200b, 200c may be a system on a chip (SOC) or a system on integrated circuit (SOIC) die; a memory die, such as a static random-access memory (SRAM) die, a dynamic random-access memory (DRAM) die, a high bandwidth memory (HBM) die, or the like; a passive device die, such as a multilayer ceramic chip (MLCC) capacitor die, an integrated passive device (IPD) die, an integrated voltage regulator (IVR) die, the like, or a combination thereof; a logic die; an analog die; a microelectromechanical system (MEMS) die, a radio frequency (RF) die, or a combination thereof.

In some embodiments, the integrated circuit dies 200a, 200b, 200c may be different types of dies to be connected together. For example, the integrated circuit die 200a may be a SOC die and the integrated circuit dies 200b and 200c may be memory dies, such as a HBM die and a DRAM die.

Similar to the integrated circuit die 100 described in FIGS. 1A-1K, each of the integrated circuit dies 200a, 200b, 200c may include a device layer 220a, 220b, 220c formed in and/or on the substrate 10a, 10b, 10c, and an interconnect structure 222a, 220b, 220c formed on the device layer 220a, 220b, 220c (shown in FIG. 3B). The interconnect structures 222a, 222b, 222c are similar to the interconnect structure 122 of the integrated circuit die 100. Similar to the integrated circuit die 100, each of the integrated circuit die 200a, 200b, 200c further includes one or more edge interconnect features 208a, 208b, 208c extending from the interconnect structures 222a, 222b, 222c into scribe lines 12a, 12b, 12c on the corresponding substrate 10a, 10b, 10c. After the integrated circuit dies 200a, 200b, 200c are fabricated and cut into individual dies, the edge interconnect features 208a, 208b, 208c are exposed on corresponding cutting surfaces 202a, 202b, 202c. As shown in FIGS. 3C and 3D, cross-sectional surfaces 208s of the edge interconnect features 208a, 208c are exposed on the cutting surfaces 202a, 202c.

In some embodiments, the edge interconnect features 208a, 208b, 208c in the integrated circuit dies 200a, 200b, 200c are arranged in the same pattern, i.e. arranged in substantially the same intervals so that the edge interconnect features 208a, 208b, 208c may be connected with one another in the subsequent packaging processes.

As shown in FIGS. 3A and 3B, the integrated circuit dies 200a, 200b, 200c are attached to a carrier substrate 302. In some embodiments, an adhesive layer 304 is formed on the carrier substrate 302, and a die attach film 306 is formed on the adhesive layer 304. The integrated circuit dies 200a, 200b, 200c are attached on the die attach film 306. The carrier substrate 302 may be a glass carrier substrate, a ceramic carrier substrate, or the like. In some embodiments, multiple semiconductor packages can be formed on the carrier substrate 302 simultaneously.

The adhesive layer 304 is placed on the carrier substrate 302 to assist in the adherence of overlying structures, for example, the integrated circuit dies 200a, 200b, 200c. In some embodiments, the adhesive layer 304 may comprise a light to heat conversion (LTHC) material or an ultra-violet glue, although other types of adhesives, such as pressure sensitive adhesives, radiation curable adhesives, epoxies, combinations of these, or the like, may also be used. The adhesive layer 304 may be placed onto the carrier substrate 302 in a semi-liquid or gel form, which is readily deformable under pressure. In other embodiments, the adhesive layer 304 may be an ultra-violet (UV) glue, which loses its adhesive property when exposed to UV lights.

The die attach film 306 may be placed on the adhesive layer 304 to assist in the attachment of the integrated circuit dies 200a, 200b, 200c to the adhesive layer 304. In some embodiments, the first die attach film 306 may be an epoxy resin, a phenol resin, acrylic rubber, silica filler, or a combination thereof, and is applied using a lamination technique. The die attach film 306 may be dispensed as a liquid and cured, may be a laminate film laminated onto the carrier substrate 302, or may be the like. In some embodiments, the top surface of the die attach film 306 may be leveled and may have a high degree of coplanarity. However, any other suitable alternative material and method of formation may alternatively be utilized.

As shown in FIGS. 3B, the integrated circuit dies 200a, 200b, 200c are placed onto the die attach film 306. The integrated circuit dies 200a, 200b, 200c may be placed using, e.g., a pick and place process, in a face-up orientation. However, any suitable method of placing the integrated circuit dies 200a, 200b, 200c onto the die attach film 306 may also be utilized.

In some embodiments, the integrated circuit dies 200a, 200b, 200c may be placed onto the carrier substrate 302 so that the edge interconnect features 208a, 208b, 208c are aligned to allow inter-chip connectors 310 (FIG. 4A) to be formed therebetween. As shown in FIG. 3A, the integrated circuit dies 200a, 200b, 200c may be placed so that one of the cutting surfaces 202a, 202b, 202c in each of the integrated circuit dies 200a, 200b, 200c faces one of the cutting surfaces 202a, 202b, 202c of the integrated circuit dies 200a, 200b to be connected. In FIG. 3A, the integrated circuit dies 200b, 200a, 200c are positioned in a linear arrangement so that the edge interconnect features 208a of the integrated circuit die 200a are to be connected with the edge interconnect features 208b of the integrated circuit die 200b and the edge interconnect features 208c of the integrated circuit die 200c.

The integrated circuit dies 200a, 200b, 200c are placed on the carrier substrate 302 with a gap 308 between the cutting surfaces 202a, 202b, 202c of the integrated circuit dies 200a, 200b, 200c to be connected. The gap 308 may have a distance 308w between the cutting surfaces 202a, 202b, 202c. In some embodiments, the distance 308w may be in arrange between about 1 μm and about 200 μm. A distance less than 1 μm may not be wide enough to properly fill an encapsulant layer therebetween. A distance greater than 200 μm may be too wide to form individual inter-chip connectors therebetween.

FIG. 3C schematically illustrates the alignment between the edge interconnect features 208a of the integrated circuit die 200a and the edge interconnect features 208c of the integrated circuit die 200c in the x-y plane. As shown in FIG. 3C, the edge interconnect features 208a, 208b, 208c of the integrated circuit die 200a, 200b, 200c may have substantially the same spacing as in the integrated circuit die 200a, 200b, 200c to be connected. FIG. 3D schematically illustrates the alignment between the edge interconnect features 208a of the integrated circuit die 200a and the edge interconnect features 208c of the integrated circuit die 200c in the z-direction. As shown in FIG. 3D, the edge interconnect features 208a, 208c may be formed in the IMD layer at the substantially the same distance from a bottom of the corresponding integrated circuit die 200a, 200c.

Referring FIG. 3B, an optional dielectric layer (not shown) may be formed between the die attach film 306 and the integrated circuit dies 200a, 200b, 200c on the backside of the integrated circuit dies 200a, 200b, 200c. One or more metallization patterns are formed on or in the dielectric layer to form a redistribution structure, such as power rails formed on a backside of the substrate 10a, 10b, 10c.

Figure 4A:
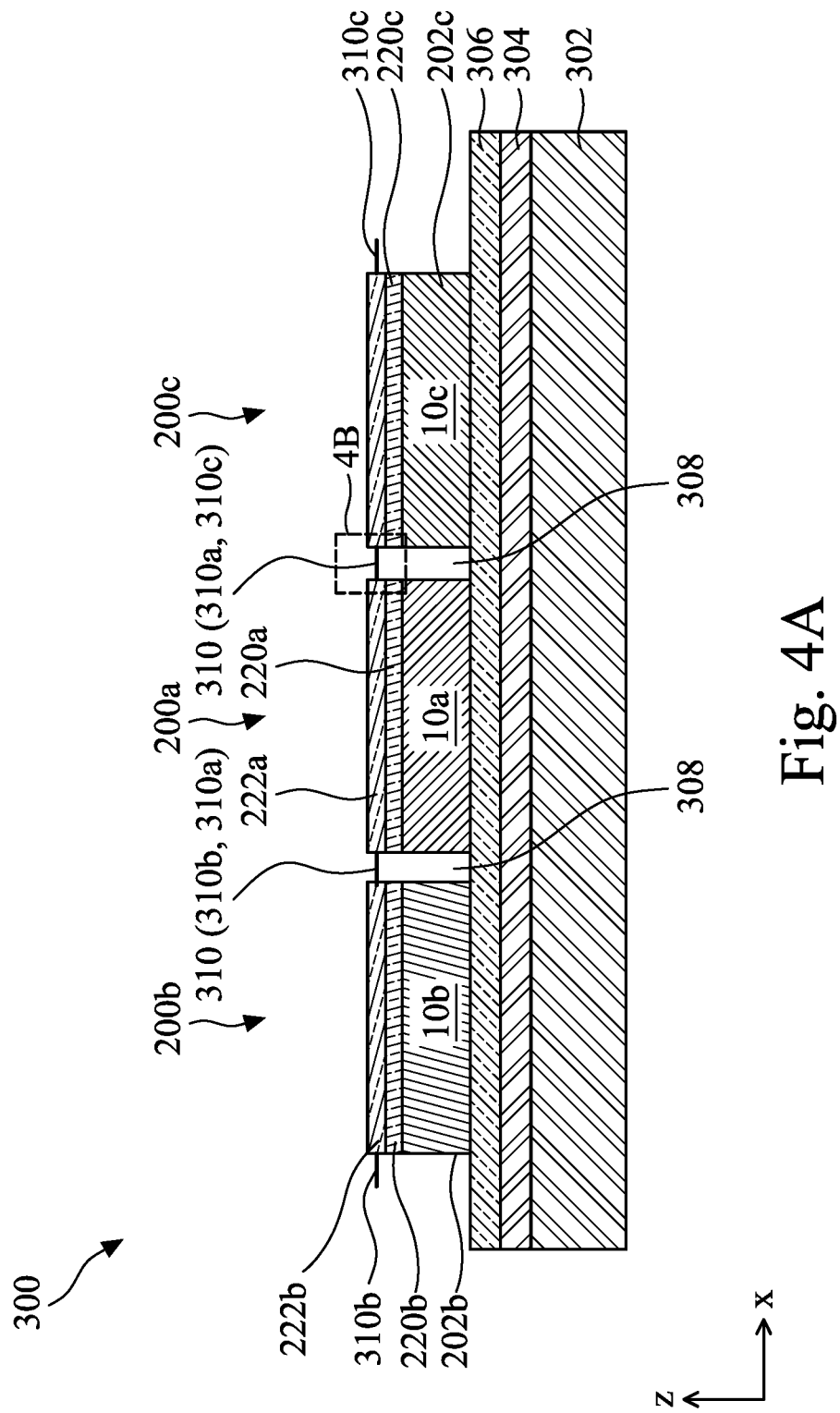
Figure 4B:
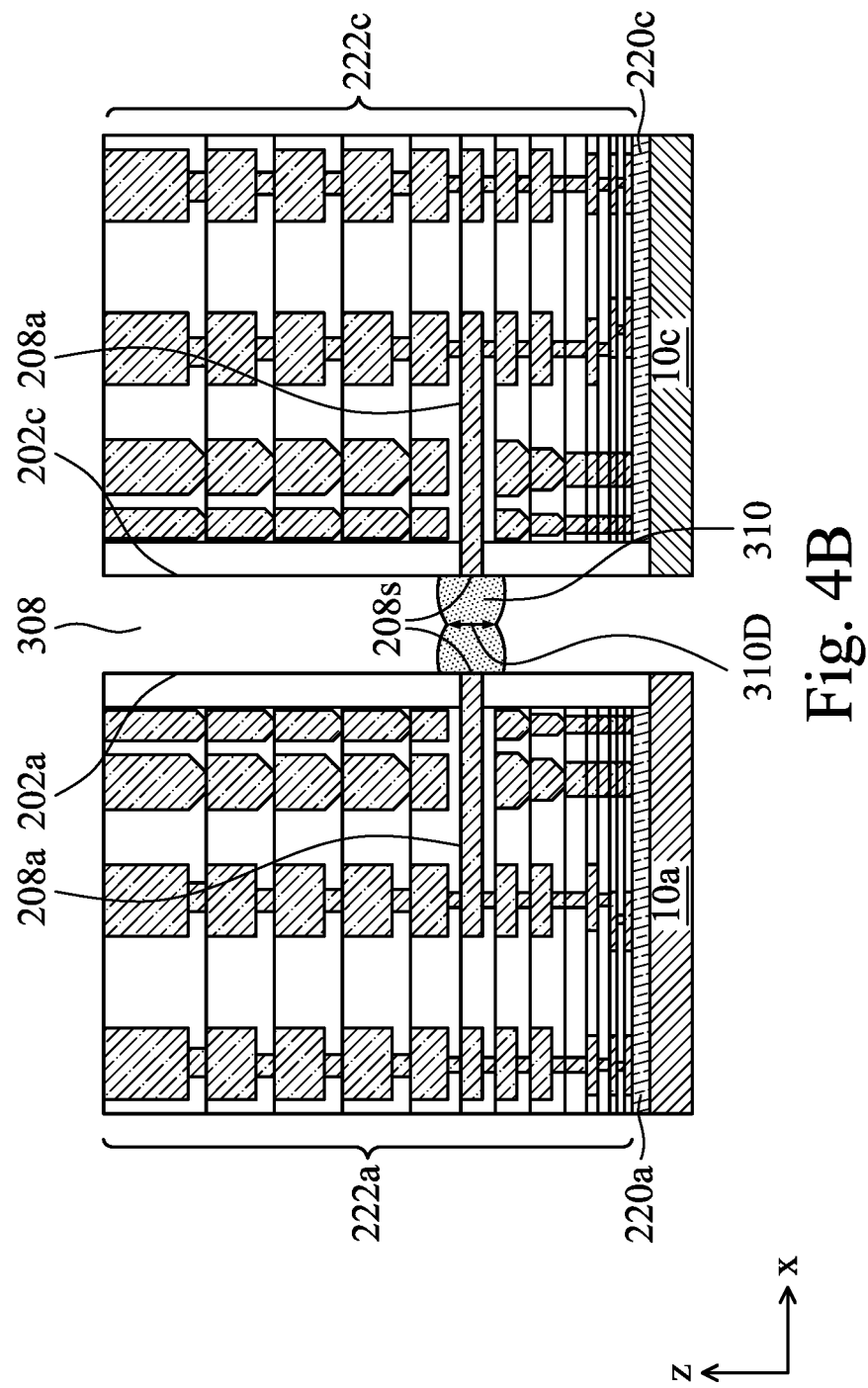
Figure 4C:
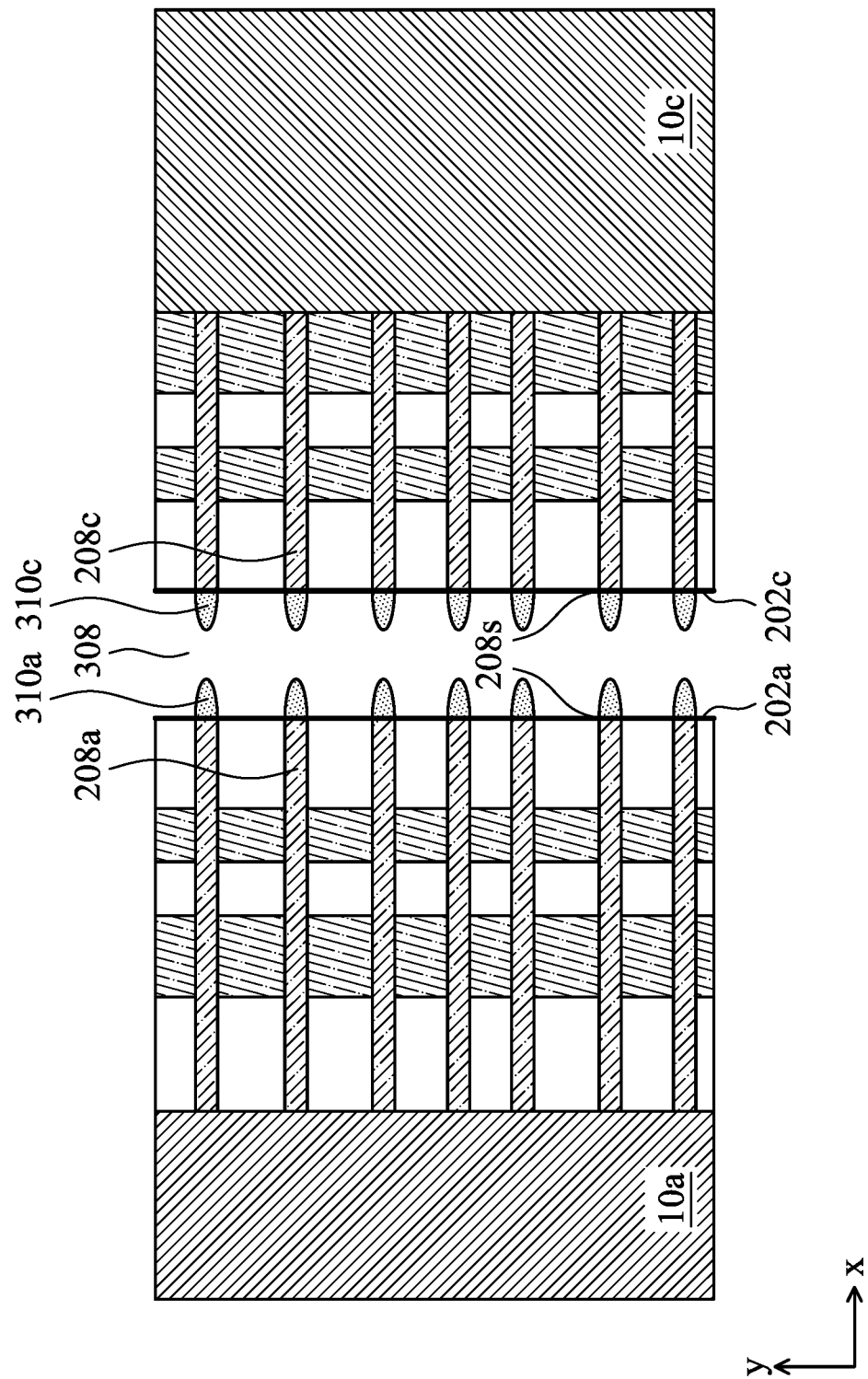

After the integrated circuit dies 200a, 200b, 200c are attached to the carrier substrate 302, a bumping process is performed to form inter-chip connectors 310 between the edge interconnect features 208a, 208b, 208c, as shown in FIGS. 4A-4D. FIG. 4A schematic cross-sectional view of the semiconductor package 300. FIG. 4B is a partial enlarged view of the area 4B in FIG. 4A. FIGS. 4C are 4D are partial enlarged views of the area 3C in FIG. 3A.

Figure 4D:
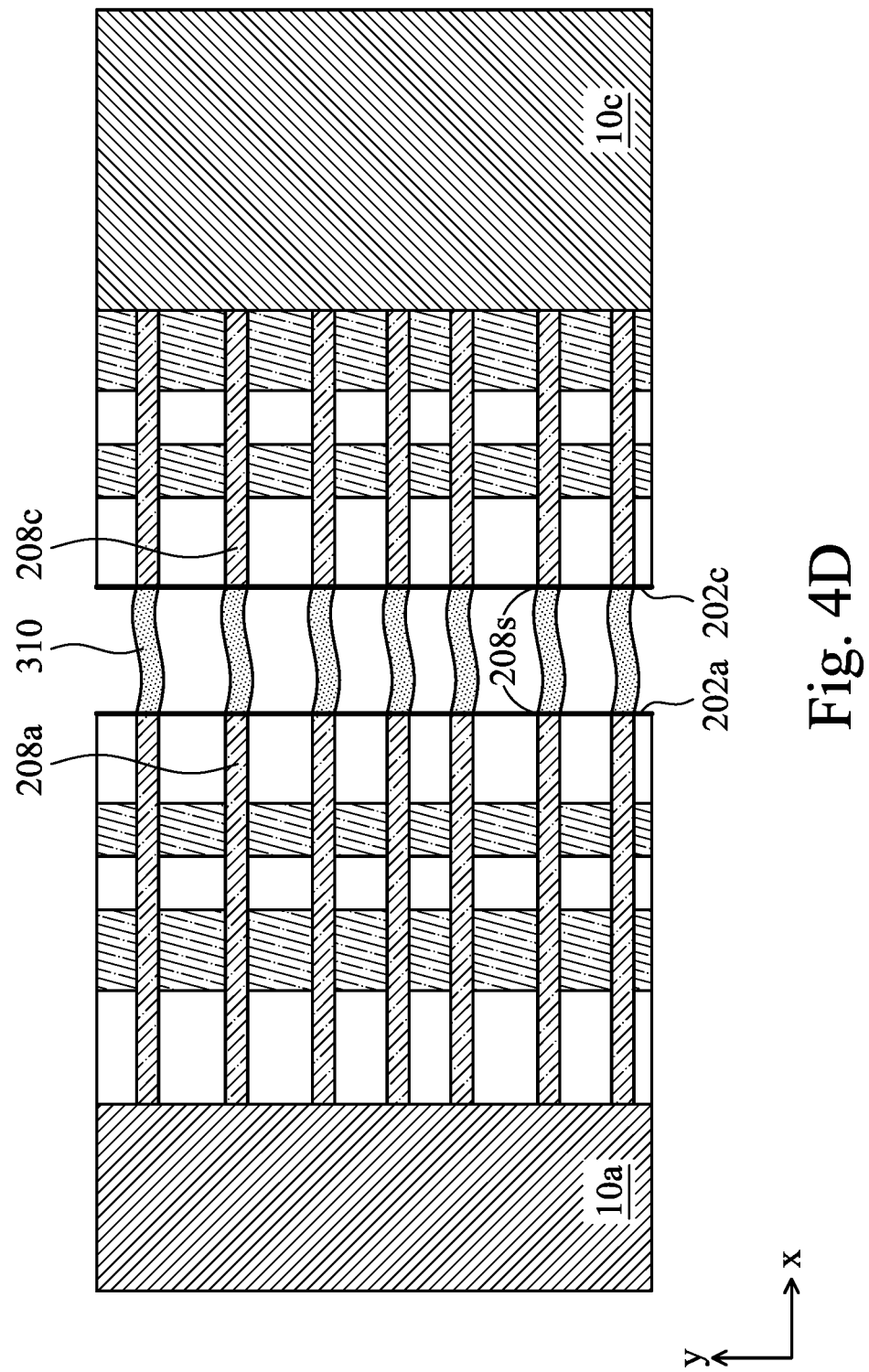

The inter-chip connectors 310 may be formed by a selective bumping process. In some embodiments, the exposed cross-sectional surfaces 208s act as catalyst or a seed layer for a selective deposition process. The inter-chip connectors 310 may be formed by any suitable deposition process, for example, by electroless deposition or by an atomic layer deposition (ALD) or by chemical vapor deposition (CVD). As shown in FIG. 4C, conductive bumping features 310a, 310b (shown in FIG. 4A), 310c may selectively form on the exposed cross-sectional surfaces 208s of the edge interconnect features 208a, 208b, 208c. As the selective deposition continues, the conductive bumping features 310a, 310b, 310c increase in dimension and join with the conductive bumping features 310a, 310b, 310c grown from the exposed cross-sectional surfaces 208s on the opposite side of the gap 308, and forming the inter-chip connectors 310, as shown in FIG. 4D. The conductive bumping features 310a, 310b, 310c on the cutting surfaces 202a, 202b, 202c without facing other integrated circuit dies may remain hanging, as shown in FIG. 4A.

After opposing conductive bumping features 310a, 310b, 310c are connected with each other, the selective deposition process may be performed for an additional time period to increase cross sectional areas of the inter-chip connectors 310, thus, reducing resistance of the inter-chip connectors 310.

Figure 5A:
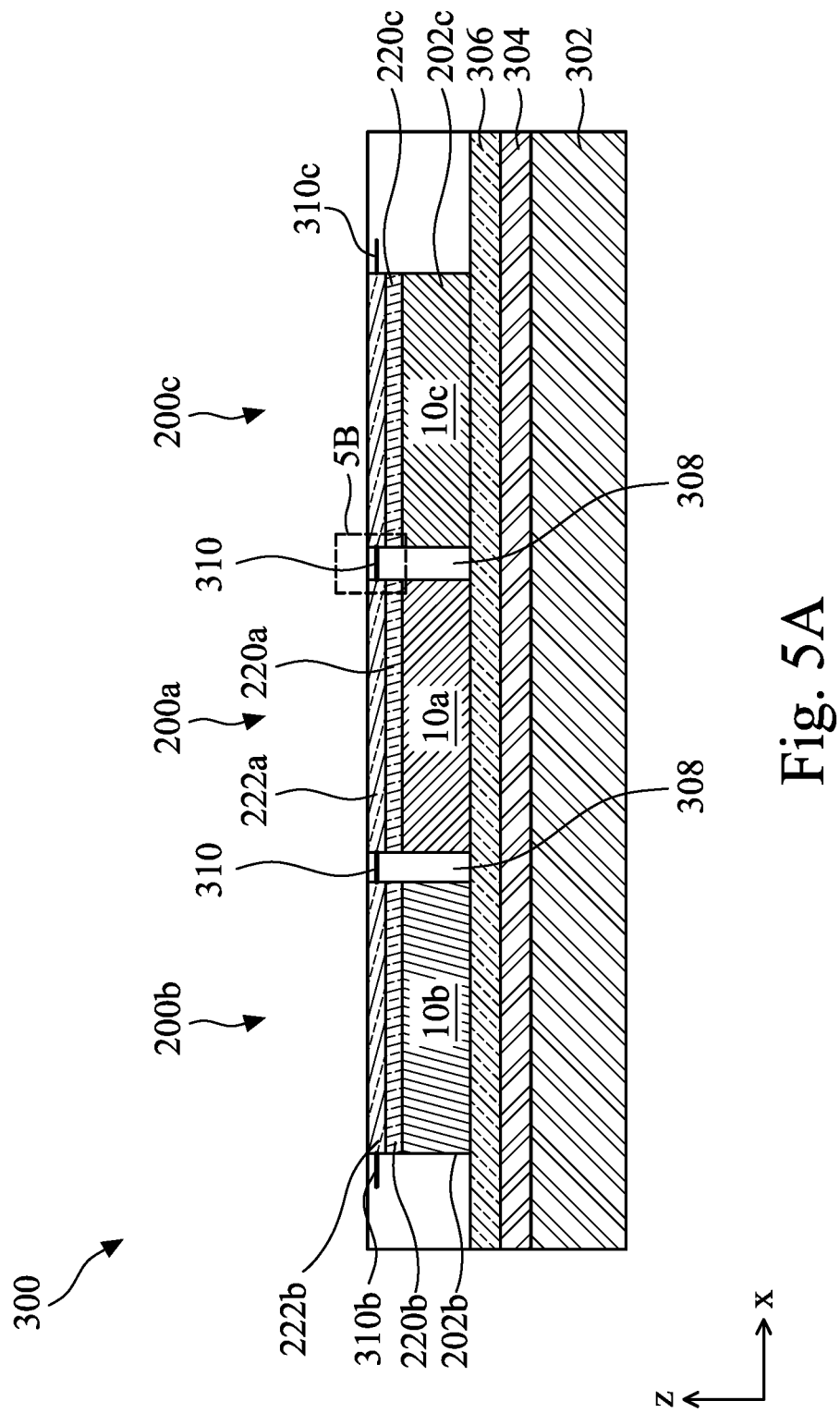
Figure 5B:
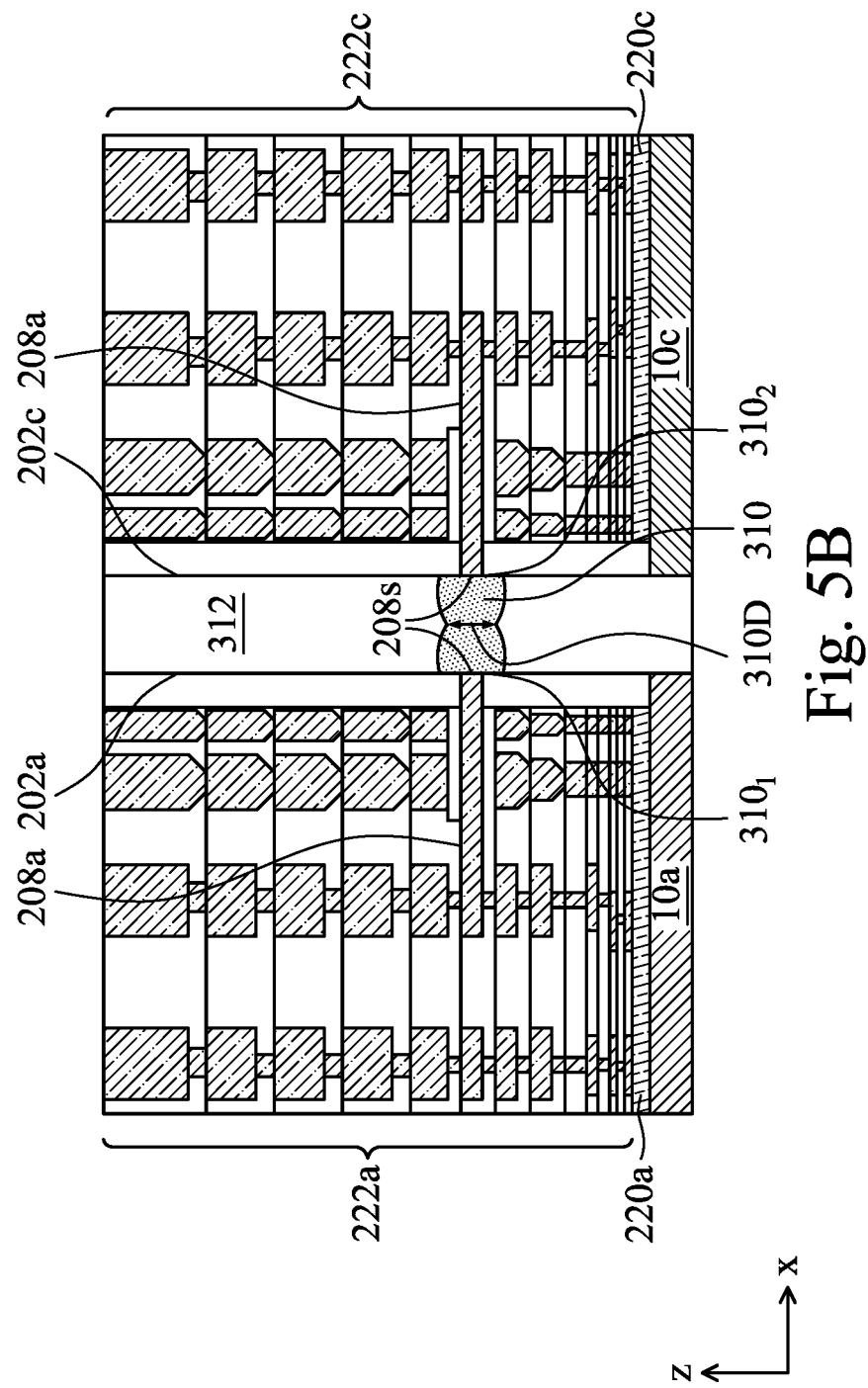

In some embodiments shown in FIG. 5B, each of the inter-chip connectors 310 may be conductive columns having a first end $310_1$ and a second end $310_2$. The first end $310_1$ is in contact with the exposed surface 208s of the edge interconnect feature 208 in a first integrated circuit die, such as the integrated circuit die 208a. The second end $310_2$ is in contact with the exposed surface 208s of the edge interconnect feature 208 in a second integrated circuit die, such as the integrated circuit die 202c. In some embodiments, a portion of the first end $310_1$ and second end $310_2$ may also be in contact with the cutting surface 202 of the integrated circuit dies 200a, 200c.

The inter-chip connectors 310 may have an average diameter 310D. In some embodiments, the average diameter 310D of the inter-chip connectors 310 may be in a range between 0.02 µm and about 12 µm. An average diameter less than 0.01 µm may not provide enough reliable electrical connection between the edge interconnect features 208a, 208b, 208c. An average diameter greater than 12 µm may cause short circuit between neighboring inter-chip connectors 310. In some embodiments, when the inter-chip connectors 310 are formed by electroless plating, the thickness of the inter-chip connectors 310 may be non-ununiformed. For example, the inter-chip connectors 310 formed by plating will be formed in X-direction and simultaneously in Z-direction, thus, the portion closer to the edge interconnect features 208a/208c will be thicker than the portions further away from the edge interconnect features 208a/208c.

The inter-chip connectors 310 and the conductive bumping features 310a, 310b, 310c may be formed from any suitable conductive material. In some embodiments, the inter-chip connectors 310 and the conductive bumping features 310a, 310b, 310c may be formed from a metal, such as Cu, Co, Ru, Mo, W, Ir, Fe, Ni, Sn, Ag, alloys thereof, or a combination thereof.

In some embodiments, the inter-chip connectors 310 and the conductive bumping features 310a, 310b, 310c may be formed by an electroless deposition process. The electroless deposition may be performed in a plating solution having a pH value in a range between about 2.0 and about 11.0. The electroplating deposition may be performed in a temperature range between room temperature and about 180° C. The electroless deposition solution may comprise reactant including metal-organic and metal-halide structures, such as Metal-CxHyOz, Metal-CxNyHz, Metal-CxOy, Metal-NxHy, Metal-Fx, Metal-Clx, Metal-Brx, the like, and a combination thereof. The metal may include Cu, Co, Ru, Mo, W, Ir, Fe, Ni, Sn, Ag, alloys thereof, or a combination thereof. The electroless deposition solution may be a water-based solution or a solvent-based solution. When a solvent-based solution is used, the process temperature may be performed between room temperature to about 180° C.

In other embodiments, the inter-chip connectors 310 and the conductive bumping features 310a, 310b, 310c may be formed by selective ALD/CVD process, for example by plasma enhanced ALD, plasma enhanced CVD, thermal ALD, or thermal CVD. Particularly, selective ALD/CVD may be achieved through surface reaction, surface state such as H-termination and surface free electron, and the sacrificial solid-state co-reactant. In some embodiments, selective deposition is enabled by catalytic behavior of a metal surface which promotes precursor reduction. The ALD/CVD process may be performed at a pressure range between about 500 mtorr and about 1 atm. The ALD/CVD may be performed in a temperature range between room temperature and about 550° C. The ALD/CVD process precursors may include metal-organic and metal-halide structures, such as Metal-CxHyOz, Metal-CxNyHz, Metal-CxOy, Metal-NxHy, Metal-Fx, Metal-Clx, Metal-Brx, the like, and a combination thereof. The metal may include Cu, Co, Ru, Mo, W, Ir, Fe, Ni, Sn, Ag, alloys thereof, or a combination thereof. In some embodiments, selective ALD may be performed by forming a catalytic contribution of surface free electrons on exposed metal surface and then selective reaction between the terminated hydrogen and the methyl radical of metal-halide structure. In another embodiment, selective CVD is performed to form cobalt on exposed edge interconnect features 208 from dicobaltoctacarbonyl and trimethylphosphine.

The inter-chip connectors 310 connect the devices in two integrated circuit dies 208a, 208b, 208c without going through any interposer (e.g., interposer substrate 316 in FIG. 6) or external connectors (e.g., external contacts 314 in FIG. 6), thus, lower power consumption. The inter-chip connectors 310 and the edge interconnect features 208a, 208b, 208c are formed in the IMD layer level, thus, with higher routing density than bumping connectors formed on or above redistribution layer.

After formation of the inter-chip connectors 310, an encapsulant layer 312 is formed over various components, including the inter-chip connectors 310, on the carrier substrate 302, as shown in FIGS. 5A and 5B. FIG. 5A is a schematic cross-sectional view of the semiconductor package 300. FIG. 5B is a partial enlarged view of the area 5B in FIG. 5A.

The encapsulant layer 312 may be a molding compound, epoxy, or the like, and may be applied by compression molding, lamination, transfer molding, or the like. The encapsulant layer 312 may be formed over the carrier substrate 302 such that the inter-chip connectors 310 and the conductive bumping features 310a, 310b, 310c hanging on the cutting surface 202s are buried or covered. The encapsulant layer 312 may then be cured.

Figure 6:
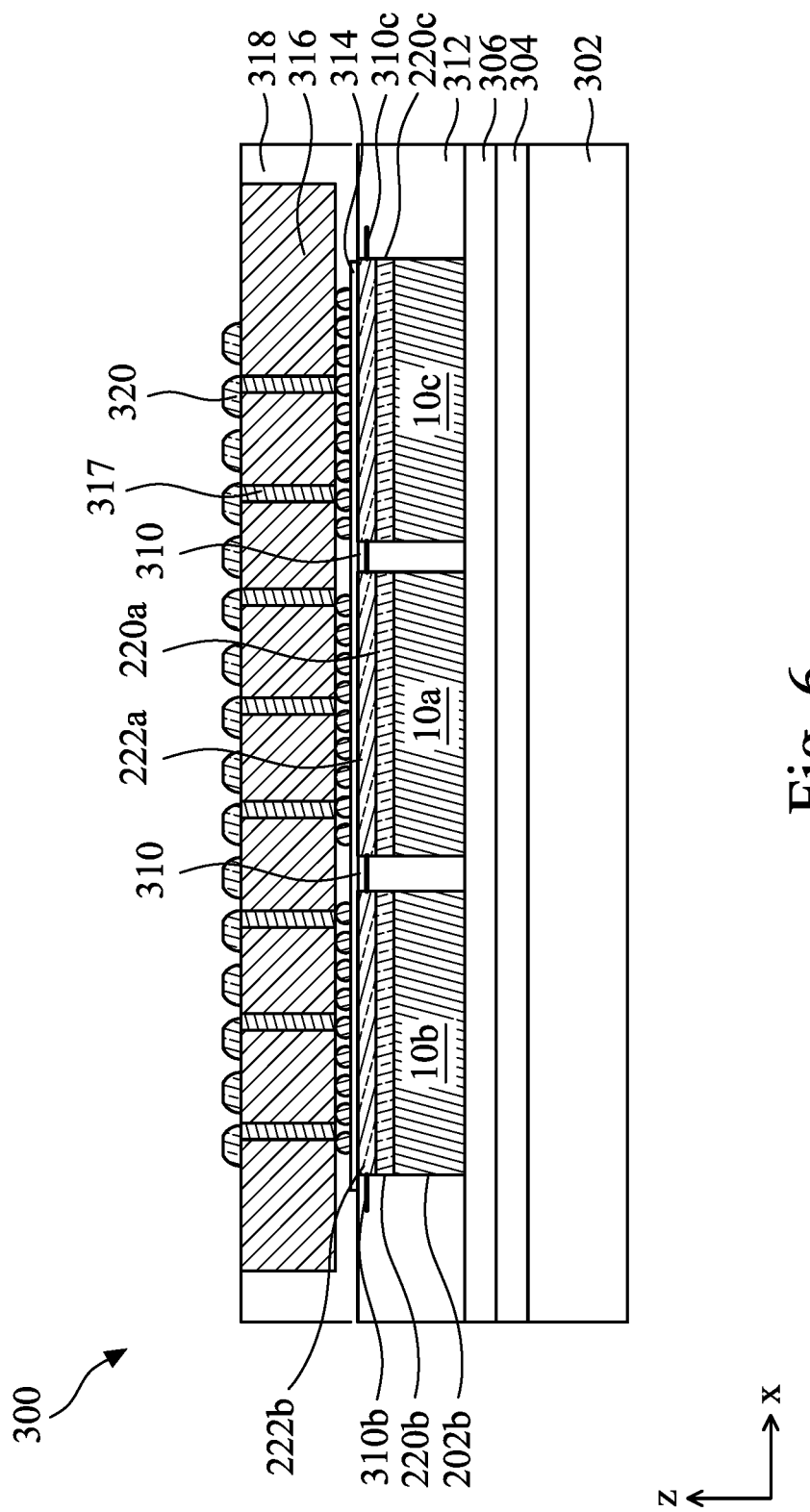

In some embodiments, the encapsulant layer 312 may undergo a grinding process to expose conductive features on the integrated circuit dies 200a, 200b, 200c so that external connectors may be formed. FIG. 6 schematic cross-sectional view of the semiconductor package 300 showing subsequent process after forming the encapsulant layer 312. External contacts 314 may be formed on the integrated circuit dies 200a, 200b, 200c, for example, by a bumping process. The external contacts 314 may be, e.g., conductive pillars such as a copper pillars or copper posts. In some embodiments, the external contacts 314 may be solder bumps, copper bumps, or other suitable external contacts that may be made to provide electrical connection from the integrated circuit dies 200a, 200b, 200c to other external devices. All such external contacts are fully intended to be included within the scope of the embodiments. As the inter-chip connectors 310 provide internal connections between or among the integrated circuit dies 200a, 200b, 200c, the external contacts 314 may be used to provide external connections to the integrated circuit dies 200a, 200b, 200c.

In some embodiments, an optional interposer substrate 316 may be attached to the external contacts 314. The interposer substrate 316 may include various embedded interconnections, which may provide routes from the external contacts 314 to external circuits, such as a printed circuit board.

An encapsulant layer 318 may then be formed over the interposer substrate 316. The encapsulant layer 318 may be a molding compound, epoxy, or the like, and may be applied by compression molding, lamination, transfer molding, or the like. The encapsulant layer 318 may be formed over the interposer substrate 316 such that the external contacts 314 are buried or covered. The encapsulant layer 318 may then be cured. In some embodiments, the encapsulant layer 318 and the encapsulant layer 312 may be formed from the same material.

In some embodiments, the encapsulant layer 318 may undergo a grinding process to expose conductive features on the interposer substrate 316. External connectors 320 are then formed on the interposer substrate 316. The external connectors 320 may be used to connect the semiconductor package 300 to a printed wiring board or printed circuit board (PCB) to form an electronic assembly. In some embodiments, through substrate vias or TSVs 317 extend vertically through the interposer substrate 316 and electrically connect the external connectors 320 and the external contacts 314. In some embodiments, the TSVs 317 may be through silicon vias where a silicon substrate material is used. TSVs 317 may be made of any suitable conductive material commonly used in the art for such vias, including without limitation tungsten, copper, nickel, or alloys thereof. In some representative embodiments, TSVs 317 may have a representative diameter, without limitation, of about 5 microns to about 12 microns depending on the design requirement and process used to form the TSVs 317.

Figure 7:
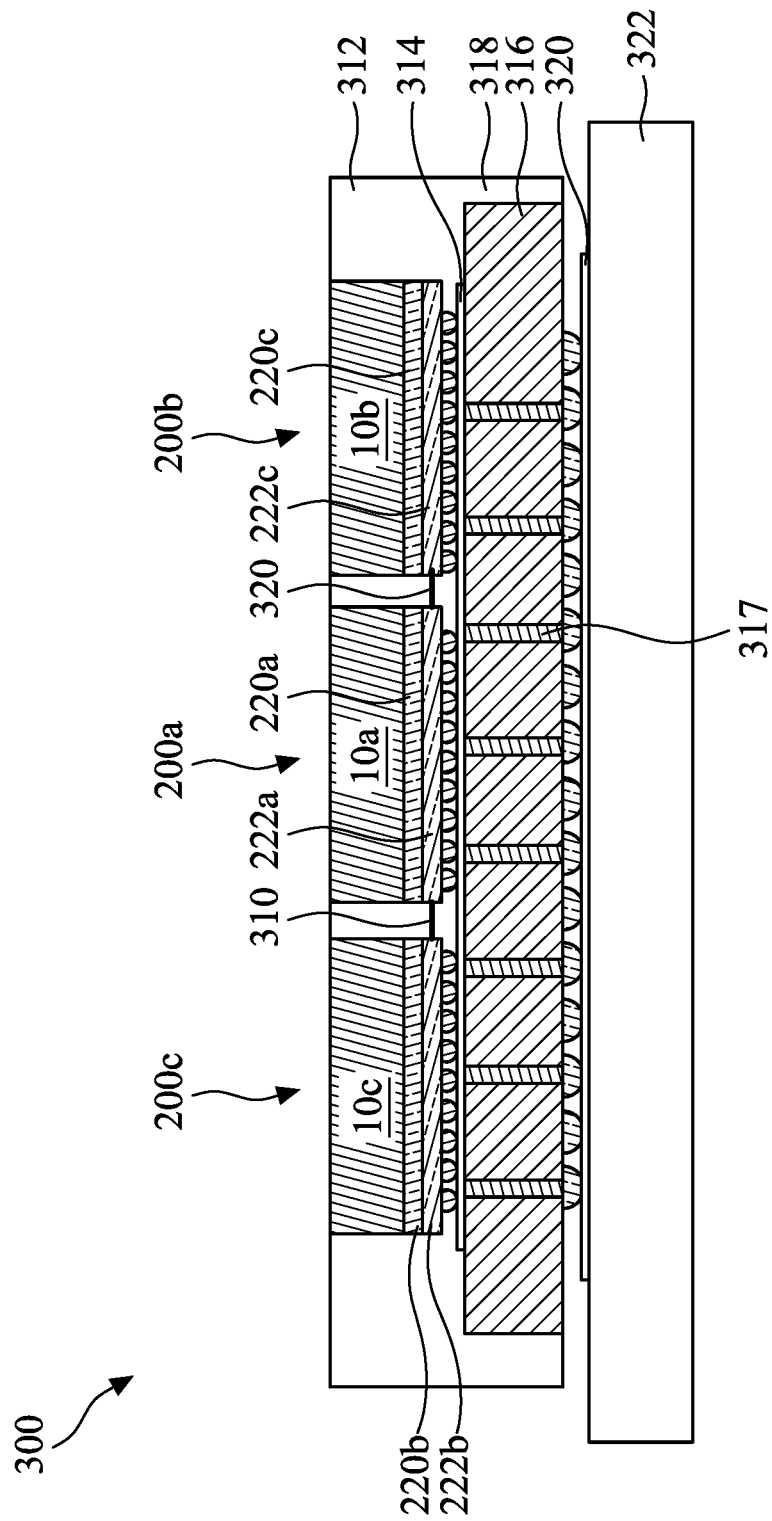

FIG. 7 schematic cross-sectional view of the semiconductor package 300 attached to a PCB 322, with the carrier substrate 302 along with the adhesive layer 304 and the die attach film 306 removed. The PCB 322 may be part of an electronic assembly can be part of an electronic system such as computers, wireless communication devices, computer-related peripherals, entertainment devices, or the like.

Even though three integrated circuit dies 200a, 200b, 200c are shown in the semiconductor package 300, less or more integrated circuit dies with edge interconnect features may be packaged together according to circuit design.

Even though the integrated circuit dies 200a, 200b, 200c in the semiconductor package 300 have substantially the same shape and the dimension, integrated circuit dies of different dimension and/or shape may be included in the semiconductor packages so along as edge interconnect features in different integrated circuit dies to be connected may be aligned for connection.

Embodiments of the present disclosure provide an integrated circuit die with edge interconnect features extending from one or more IMD layers to a side surface of the integrated circuit die. The edge interconnect features of different integrated circuit dies may be connected by a selective bumping process to enable direct connection between the integrated circuit dies. The direct connection between different integrated circuit dies reduces interposer layers, redistribution process, and bumping processes in multi-die integration, thus, reducing cost of manufacturing. The edge interconnect features also enable power to be directly transferred therethrough, instead of going through interposer substrates, or PCBs, thus achieve higher performance. The edge interconnect features, connected to one or more IMD layers, also enables higher routing density than through an interposer. The edge interconnect features design may be easily adopted from one integrated circuit die to another, thus, provide high feasibility and flexibility for designers.

Some embodiments of the present provide a semiconductor package comprising a first integrated circuit die having a first cutting surface, wherein the first integrated circuit die comprises a first edge interconnect feature extending to the first cutting surface, a second integrated circuit die having a second cutting surface, wherein the second integrated circuit die comprises a second edge interconnect feature extending to the second cutting surface, and an inter-chip connector having a first end contacting the first edge interconnect feature and a second end contacting the second edge interconnect feature.

Some embodiments of the present disclosure provide a semiconductor package. The semiconductor package includes a substrate, a first integrated circuit die attached to the substrate, wherein the first integrated circuit die has a first cutting surface, a second integrated circuit die attached to the substrate adjacent the first integrated circuit die, wherein the second integrated circuit die has a second cutting surface, and the first cutting surface faces the second cutting surface, and a plurality of inter-chip connectors formed between the first integrated circuit die and second integrated circuit die, wherein a first end of each of the inter-chip connector contacts the first cutting surface and a second end of the inter-chip connector contacts the second cutting surface.

Some embodiments of the present disclosure provide a method for forming a semiconductor device. The method includes forming a first integrated circuit die having a first edge interconnect feature, and a second integrated circuit die having a second edge interconnect feature, wherein the first edge interconnect feature is exposed on a cutting surface of the first integrated circuit die, and the second edge interconnect feature is exposed on a cutting surface of the second integrated circuit die, positioning the first and second integrated circuit dies adjacent to each other such that the first edge conductive feature faces the second edge conductive feature, and forming an inter-chip connector between the first edge conductive feature and the second edge conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
   forming a first integrated circuit die having a first edge interconnect feature, and a second integrated circuit die having a second edge interconnect feature, wherein the first integrated circuit die is diced along a first cutting surface and the second integrated circuit die is diced along a second cutting surface, the first edge interconnect feature is exposed on the first cutting surface of the first integrated circuit die, and the second edge interconnect feature is exposed on the second cutting surface of the second integrated circuit die;
   positioning the first and second integrated circuit dies adjacent to each other such that the first edge interconnect feature faces the second edge interconnect feature; and
   forming an inter-chip connector between the first edge interconnect feature and the second edge interconnect feature.

2. The method of claim 1, wherein forming the inter-chip connector comprises performing a selective deposition.

3. The method of claim 2, wherein the selective deposition is performed by an electroless deposition process.

4. The method of claim 2, wherein the selective deposition is performed by an ALD (atomic layer deposition) or CVD (chemical vapor deposition) process.

5. The method of claim 1, wherein forming the first integrated circuit die comprises:
   forming a device layer including one or more semiconductor devices; and
   forming an IMD layer over the device layer, wherein the IMD (inter metal dielectric) layer includes the first edge interconnect feature.

6. The method of claim 5, where forming the first integrated circuit die further comprises:
   forming a sealing ring in the IMD layer adjacent a perimeter of the first integrated circuit die, wherein the sealing ring has an opening, and the first edge interconnect feature extends through the opening.

7. A method, comprising:
   positioning a first integrated circuit die next to a second integrated circuit die on a substrate, wherein the first integrated circuit die comprises a first cutting surface and a first edge interconnect feature extending exposed to the first cutting surface, the second integrated circuit die comprises a second cutting surface and a second edge interconnect feature extending to the second cutting surface, and the first and second circuit dies are positioned with the first cutting surface facing the second cutting surface; and
   forming an inter-chip connector between the first cutting surface and the second cutting surface, wherein the inter-chip connector includes a first end contacting the first edge interconnect feature and a second end contacting the second edge interconnect feature.

8. The method of claim 7, wherein the first integrated circuit die further comprises a first interconnect structure, and the first edge interconnect feature is connected to the first interconnect structure.

9. The method of claim 8, wherein the first interconnect structure comprises:
   an IMD (inter metal dielectric) layer; and
   a conductive feature embedded in the IMD layer, wherein an inner end of the first edge interconnect feature is connected to the conductive feature, and an outer end of the first edge interconnect feature extends to the first cutting surface of the first interconnect feature.

10. The method of claim 9, wherein the first interconnect structure further comprises a sealing ring, and the first edge interconnect feature extends through an opening in the sealing ring.

11. The method of claim 10, further comprising forming an encapsulant layer between the first integrated circuit die and the second integrated circuit die, and wherein the inter-chip connector is formed in the encapsulant layer.

12. The method of claim 9, wherein the first integrated circuit die further comprises a plurality of external contacts formed on the first interconnect structure.

13. The method of claim 12, further comprising attaching an interposer substrate to the plurality of external contacts of the first integrated circuit die.

14. A method, comprising:
   attaching a first integrated circuit die to a substrate, wherein the first integrated circuit die has a first cutting surface;
   attaching a second integrated circuit die attached to the substrate adjacent the first integrated circuit die, wherein the second integrated circuit die has a second cutting surface, and the first cutting surface faces the second cutting surface; and
   forming a plurality of inter-chip connectors between the first integrated circuit die and second integrated circuit die, wherein a first end of each of the inter-chip connector contacts the first cutting surface and a second end of the inter-chip connector contacts the second cutting surface.

15. The method of claim 14, wherein the substrate is an interposer substrate, and the first integrated circuit die connected to the interposer substrate through a plurality of first external contacts.

16. The method of claim 15, further comprising forming an encapsulant layer, wherein the plurality of inter-chip connectors are embedded in the encapsulant layer.

17. The method of claim 14, wherein the first integrated circuit die comprises:
- one or more transistors;
- an interconnect structure comprising two or more IMD layers formed over the one or more transistors; and
- a plurality of edge interconnect features, wherein each of the plurality of edge interconnect feature has an inner end embedded in one of the two or more IMD layers and an outer end in contact with one of the plurality of the inter-chip connectors.

18. The method of claim 17, wherein the interconnect structure comprises a sealing ring formed in the two or more IMD layers, and the plurality of edge interconnect features extend through openings in the sealing ring.

19. The method of claim 17, wherein the first integrated circuit die has four cutting surfaces including the first cutting surface, and the plurality of edge interconnect features are symmetrically distributed along all of the four cutting surfaces of the first integrated circuit die.

20. The method of claim 19, further comprises a plurality of conductive bumping features in contact with the plurality of edge interconnect features on all of the four cutting surfaces of the first integrated circuit die.

\* \* \* \* \*